United States Patent
Mcknight-Macneil et al.

(10) Patent No.: US 11,342,248 B2
(45) Date of Patent: May 24, 2022

(54) EMBEDDED DIE PACKAGING FOR POWER SEMICONDUCTOR DEVICES

(71) Applicant: GaN Systems Inc., Ottawa (CA)

(72) Inventors: Cameron Mcknight-Macneil, Nepean (CA); Greg P. Klowak, Ottawa (CA)

(73) Assignee: GaN Systems Inc., Kanata (CA)

( * ) Notice: Subject to any disclaimer, the term of this patent is extended or adjusted under 35 U.S.C. 154(b) by 0 days.

(21) Appl. No.: 16/928,305

(22) Filed: Jul. 14, 2020

(65) Prior Publication Data
US 2022/0020669 A1    Jan. 20, 2022

(51) Int. Cl.
| | |
|---|---|
| H01L 23/495 | (2006.01) |
| H01L 23/482 | (2006.01) |
| H01L 23/498 | (2006.01) |
| H01L 23/522 | (2006.01) |
| H01L 23/532 | (2006.01) |

(Continued)

(52) U.S. Cl.
CPC .... *H01L 23/49503* (2013.01); *H01L 23/3107* (2013.01); *H01L 23/4824* (2013.01); *H01L 23/49844* (2013.01); *H01L 23/5226* (2013.01); *H01L 23/53228* (2013.01); *H01L 24/18* (2013.01); *H01L 29/2003* (2013.01); *H01L 29/778* (2013.01); *H01L 2224/04105* (2013.01);

(Continued)

(58) Field of Classification Search
CPC .................................................. H01L 23/49503
USPC ........................................................ 257/676
See application file for complete search history.

(56) References Cited

U.S. PATENT DOCUMENTS

| | | |
|---|---|---|
| 6,946,740 B2 | 9/2005 | Schaffer |
| 8,766,711 B2 | 7/2014 | Takemae |

(Continued)

FOREIGN PATENT DOCUMENTS

| | | | |
|---|---|---|---|
| EP | 2426744 A2 | 3/2012 | |
| JP | 3888943 B2 * | 3/2007 | ............ H01L 24/18 |

(Continued)

OTHER PUBLICATIONS

EPO English Machine translation of JP5696786 equivalent of WO2013001726; 39 pages.

(Continued)

*Primary Examiner* — Ajay Arora
(74) *Attorney, Agent, or Firm* — Miltons IP/p.i.

(57) ABSTRACT

Embedded die packaging for high voltage, high temperature operation of power semiconductor devices is disclosed, wherein a power semiconductor die is embedded in laminated body comprising a layer stack of a plurality of dielectric layers and electrically conductive layers. For example, the dielectric layers comprise dielectric build-up layers of filled or fiber reinforced dielectric and conductive interconnect comprises copper layers and copper filled vias. Where a solder resist coating is provided, a dielectric build-up layer, e.g. filled or glass fiber reinforced epoxy, is provided between the solder resist coating and underlying copper interconnect, particularly in regions which experience high electric field during operation, such as between closely spaced source and drain interconnect metal. For example, the power semiconductor device comprises a GaN HEMT rated for operation at $\geq 100V$ wherein the package body has a laminated structure configured for high voltage, high temperature operation with improved reliability.

35 Claims, 10 Drawing Sheets

(51) Int. Cl.
  *H01L 29/20* (2006.01)
  *H01L 29/778* (2006.01)
  *H01L 23/00* (2006.01)
  *H01L 23/31* (2006.01)
(52) U.S. Cl.
  CPC .............................. *H01L 2224/82* (2013.01);
   *H01L 2924/13091* (2013.01)

(56) References Cited

U.S. PATENT DOCUMENTS

| | | | |
|---|---|---|---|
| 9,105,560 B2 | 8/2015 | Roberts et al. | |
| 9,153,509 B2 | 10/2015 | Klowak et al. | |
| 9,589,868 B2 | 3/2017 | Mcknight-Macneil et al. | |
| 9,589,869 B2 | 3/2017 | Mcknight-Macneil et al. | |
| 9,659,854 B2 | 5/2017 | Klowak et al. | |
| 9,824,949 B2 | 11/2017 | Mcknight-Macneil et al. | |
| 2003/0015342 A1* | 1/2003 | Sakamoto | H01L 23/49816 174/250 |
| 2007/0057364 A1* | 3/2007 | Wang | H01L 33/642 257/701 |
| 2007/0246812 A1* | 10/2007 | Zhuang | H01L 25/115 257/678 |
| 2009/0108437 A1 | 4/2009 | Raymond | |
| 2009/0224378 A1* | 9/2009 | Chen | H01L 23/5389 257/666 |
| 2010/0048789 A1 | 2/2010 | Shieh et al. | |
| 2011/0140172 A1 | 6/2011 | Chu | |
| 2012/0199875 A1 | 8/2012 | Bhalla | |
| 2012/0217616 A1 | 8/2012 | Matsuoka | |
| 2012/0228696 A1 | 9/2012 | Carpenter | |
| 2013/0087803 A1 | 4/2013 | Kizilyalli | |
| 2013/0112985 A1 | 5/2013 | Kizilyalli | |
| 2014/0061884 A1 | 3/2014 | Carpenter | |
| 2014/0159063 A1 | 6/2014 | Odnoblyudov | |
| 2014/0175454 A1 | 6/2014 | Roberts | |
| 2014/0175628 A1 | 6/2014 | Pan | |
| 2014/0264427 A1 | 9/2014 | Tischler | |
| 2014/0264804 A1 | 9/2014 | Terrill | |
| 2015/0001692 A1 | 1/2015 | Tsai | |
| 2015/0155251 A1* | 6/2015 | Kawakita | H01L 24/03 257/773 |
| 2015/0162252 A1 | 6/2015 | Klowak et al. | |
| 2015/0171240 A1 | 6/2015 | Kapur | |
| 2015/0214129 A1 | 7/2015 | Kawakita | |
| 2016/0240471 A1 | 8/2016 | Klowak | |
| 2016/0247748 A1 | 8/2016 | Kinzer | |
| 2016/0285418 A1 | 9/2016 | Jones | |
| 2016/0380090 A1 | 12/2016 | Roberts | |
| 2017/0077019 A1 | 3/2017 | Sugaya | |
| 2017/0301633 A1 | 10/2017 | Kobayashi | |
| 2018/0098430 A1* | 4/2018 | Sato | H01L 24/16 |
| 2018/0254228 A1 | 9/2018 | Kuga | |
| 2018/0366400 A1 | 12/2018 | Mohn | |
| 2019/0021175 A1 | 1/2019 | Tosaka et al. | |
| 2019/0363029 A1 | 11/2019 | Guillon | |
| 2020/0066609 A1 | 2/2020 | Mohn | |
| 2020/0105677 A1 | 4/2020 | Chiba | |
| 2020/0395475 A1* | 12/2020 | Bothe | H01L 21/28575 |

FOREIGN PATENT DOCUMENTS

| | | |
|---|---|---|
| WO | 2012103633 A1 | 8/2012 |
| WO | 2013001726 | 1/2013 |
| WO | 2015061881 A1 | 5/2015 |

OTHER PUBLICATIONS

GaN Systems Inc., Product list dated Jan. 2019; 4 pages.
GaN Systems Inc. Application Note GN002 entitled "Thermal Design for GaN Systems' Top-side cooled GaNPX®-T packaged devices"(Oct. 30, 2018); 20 pages.
Hitachi, MCL-E-770G Type (R) product datasheet, p. 16-17 from Catalog dated Jun. 2018.
Panasonic, R1577 product datasheet, dated Jun. 2017; 7 pages.
GaN Systems Inc.; Application Note entitled "Thermal Analysis and PCB Design Guidelines for GaN Enhancement Mode Power Switching Transistors"; GN005 Rev-2014-11-04 (Nov. 2014); pp. 1-14.
Oknaian, S.—International Rectifier Corporation; article entitled "Power Block Innovations Enhance Synchronous Buck Converters"; Bodo's Power Systems; Oct. 2013; (www.bodospower.com); pp. 36-38.
Zotter, W.; AT&S presentation entitled "3D Component Packaging in Organic Substrate"; Jun. 2012; 33 pages.
AT&S presentation entitled "AT&S Advanced Packaging ECP"; 2013; 18 pages.
GaN Systems Inc.; Application Note entitled "How to Drive GaN Enhancement Mode Power Switching Transistors"; GN001 Rev. 2014-10-21 (Oct. 2014); pp. 1-13.
International Search Report issued on International Patent Application No. PCT/CA2015/000244 dated Jul. 24, 2015; 7 pages.
He, Ate et al.; "All-Copper Chip-to-Substrate Interconnects Part II. Modeling and Design", J. Electrochem. Soc., 155(4) D314-D322 (2008).
Lee, Han S.; "GaN-on-Silicon-Based Power Switch in Sintered, Dual-Side Cooled Package", Power Electronics, Jan. 2, 2013; 10 pages.
Yannou, Jean-Marc et al.; "Analysis of innovation trends in packaging for power modules", 7th European Advance Technology Workshop on Micropackaging and Thermal Management, IMAPS 2012, Feb. 1-2, 2012; 33 pages.
Patterson, Deborah S.; "2.5/3D Packaging Enablement through Copper Pillar Technology", Chip Scale Review, May-Jun. 2012; pp. 20-26.
Amkor Technology Inc.; "3D Bondwire Electrical Modeling Results" 2001; pp. 1-3.

* cited by examiner

Example GaN*Px* embedded package with bottom-side thermal pad "B-Type"

Example GaN*Px* embedded package with top-side thermal pad "T-type"

Example layer structure of GaN*Px* type embedded package with bottom side thermal pad

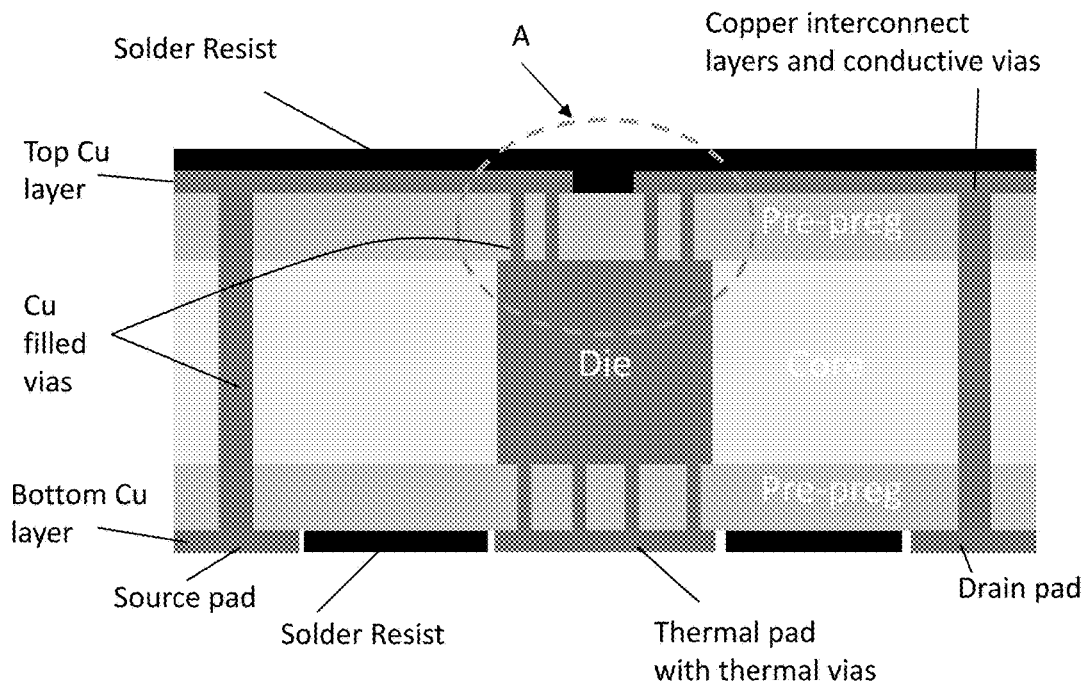
Example of conventional layup of a typical embedded package
Fig.4 (Prior Art)
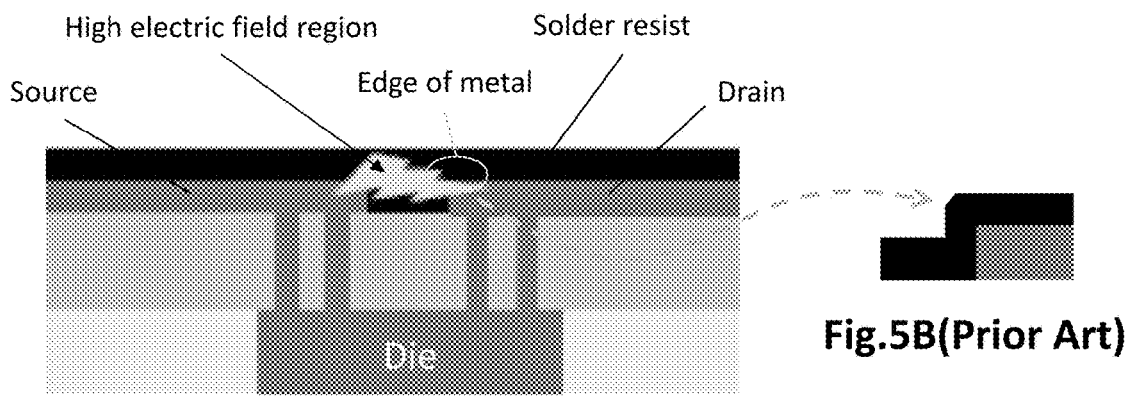
Enlarged view of region A of Fig. 4
Fig.5A (Prior Art)
Fig.5B (Prior Art)

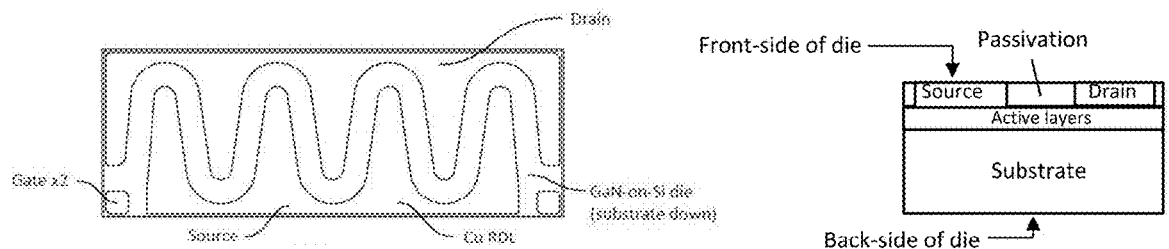
Fig. 6A  Fig. 6B
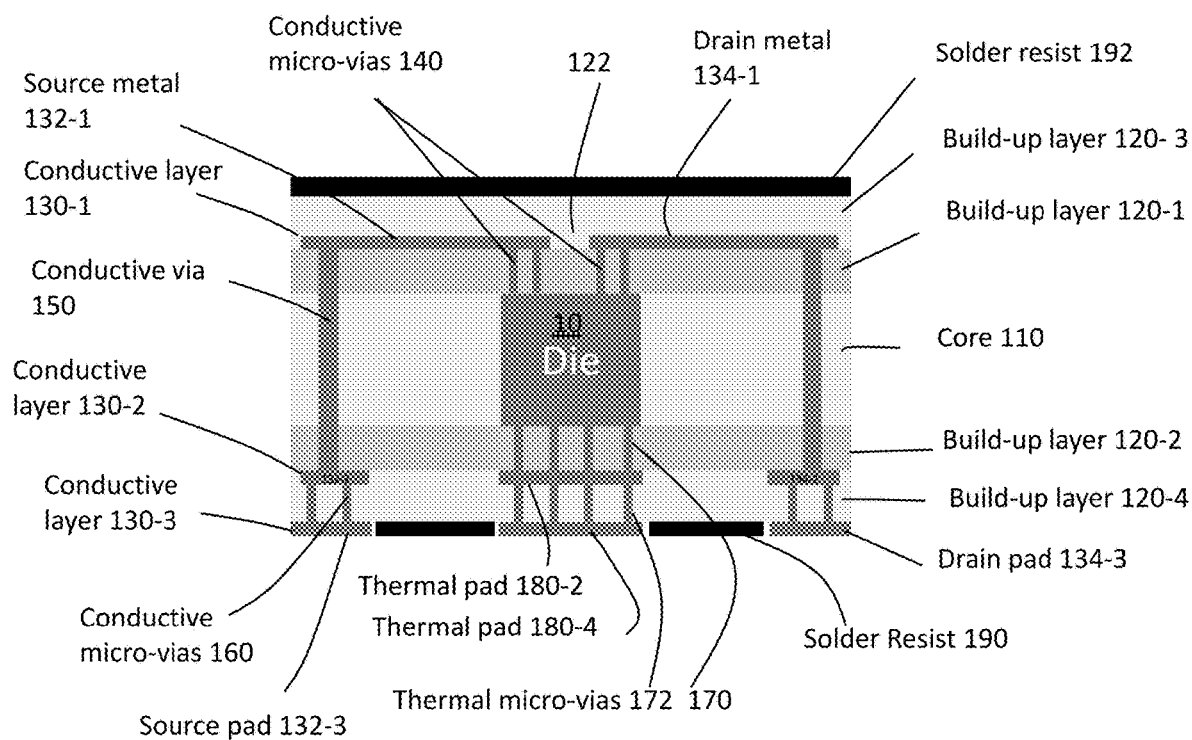
Fig. 7

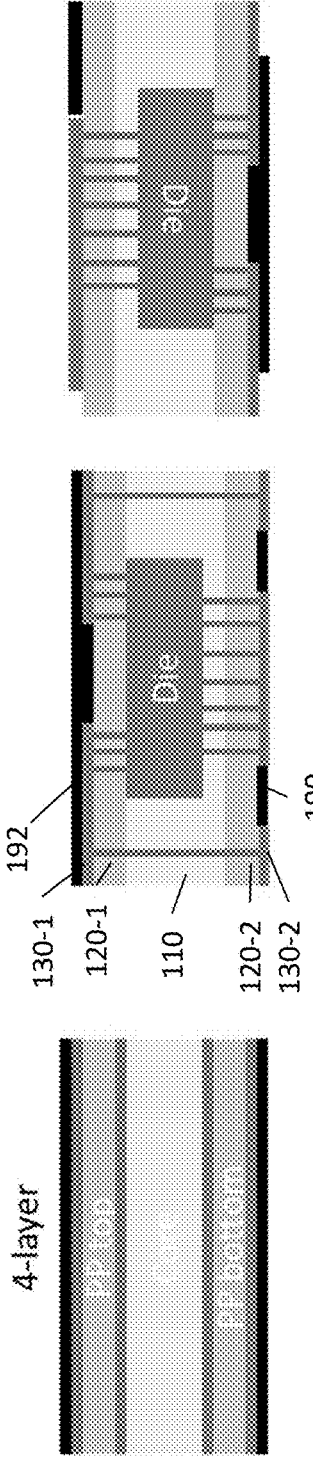
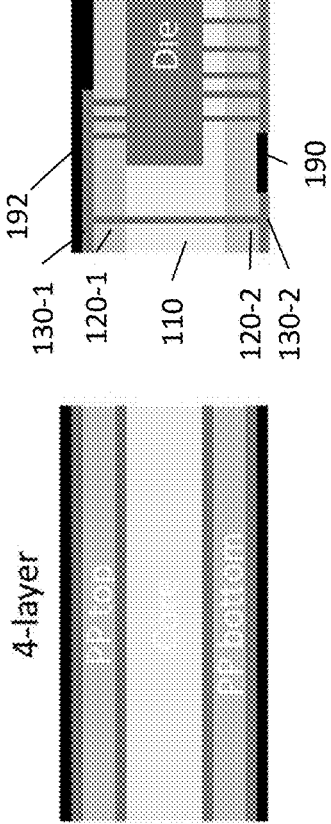
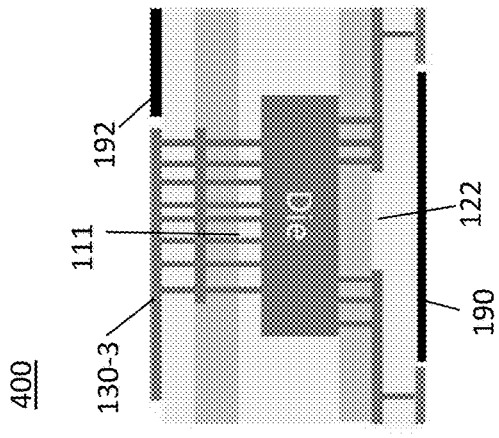
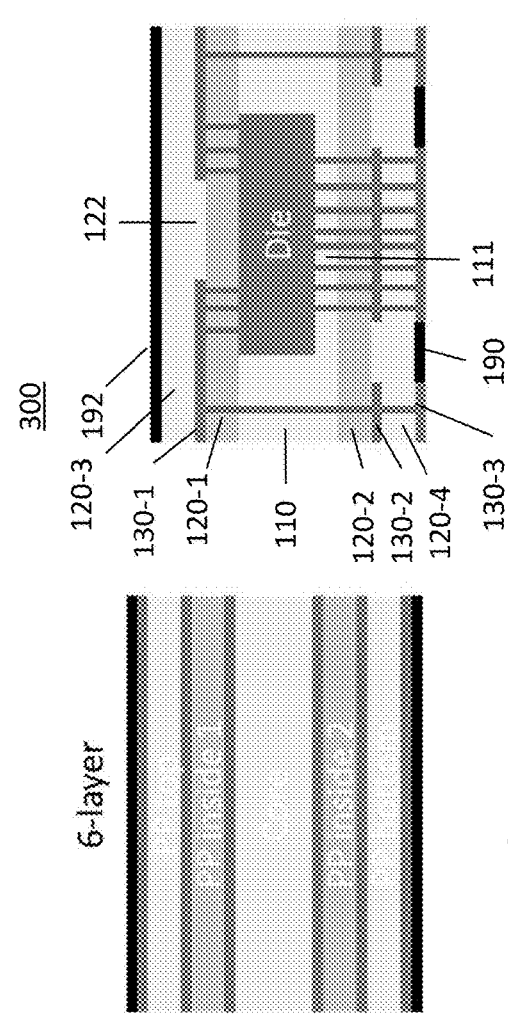

800

US 11,342,248 B2

EMBEDDED DIE PACKAGING FOR POWER SEMICONDUCTOR DEVICES

CROSS-REFERENCE TO RELATED APPLICATION(S)

This application is related to U.S. patent application Ser. No. 16/380,318 filed 10 Apr. 2019, entitled "Embedded Packaging for High Voltage High Temperature Operation of Power Semiconductor Devices", which is incorporated herein by reference in its entirety.

TECHNICAL FIELD

This invention relates to embedded die packaging for power semiconductor devices, such as Gallium Nitride (GaN) High Electron Mobility Transistors (HEMTs) for high voltage and high temperature operation.

BACKGROUND

GaN power transistors, such as GaN HEMTs, provide for high current, high voltage operation combined with high switching frequency. For some power applications, GaN power devices and systems offers advantages over silicon technology using Si IGBTs and diodes and SiC power transistors and diodes. For example, power switching systems comprising lateral GaN transistors provide higher efficiency switching, with lower losses, and smaller form factor than comparable systems based on silicon or SiC technology. To benefit from the inherent performance characteristics of lateral GaN transistors, important design considerations include, e.g.: device layout (topology), low inductance interconnect and packaging, and effective thermal management. Lateral GaN power transistors for high current operation at 100V and 650V operation are currently available from GaN Systems Inc. based on Island Technology® that provides a large gate width $W_g$, low on-resistance, $R_{on}$, and high current capability per unit active area of the device.

Packaging solutions that offer low inductance interconnections, and either top-side or bottom-side thermal pads, are disclosed, for example, in the Applicant's earlier filed patent documents: U.S. patent application Ser. No. 15/027,012, filed Apr. 15, 2015, now U.S. Pat. No. 9,659,854, entitled "Embedded Packaging for Devices and Systems Comprising Lateral GaN Power Transistors"; U.S. patent application Ser. No. 15/064,750, filed Mar. 9, 2016, now U.S. Pat. No. 9,589,868, entitled "Packaging Solutions for Devices and Systems Comprising Lateral GaN Power Transistors"; U.S. patent application Ser. No. 15/064,955, filed Mar. 9, 2016, now U.S. Pat. No. 9,589,869, entitled "Packaging Solutions for Devices and Systems Comprising Lateral GaN Power Transistors"; and U.S. patent application Ser. No. 15/197,861, filed Jun. 30, 2016, now U.S. Pat. No. 9,824,949, entitled "Packaging Solutions for Devices and Systems Comprising Lateral GaN Power Transistors".

The above-referenced patents disclose examples of "embedded packaging" in which the GaN die is embedded in a dielectric package body, e.g.: a dielectric polymer resin composition, such as a plastic encapsulation material or a glass fiber epoxy composite, such as FR4 type materials, or a ceramic composite material. Conductive interconnects through the dielectric layers are provided e.g., by copper traces, posts and vias, that provide low inductance interconnections to external contact pads (lands) for source, drain and gate connections. In some types of encapsulated packaging, the GaN die is embedded by overmolding or injection of a polymer dielectric material around the die and conductive interconnect materials. Alternatively, the dielectric body of laminated packaging for embedded GaN dies may be built up from layers of dielectric materials, e.g. as described in Application Note GN002 entitled "Thermal Design for GaN Systems' Top-side cooled GaNPx®-T packaged devices" (30 Oct. 2018 GaN Systems Inc.). This type of laminated packaging provides low parasitic inductance in a compact (i.e. small form factor) package for high voltage, high current GaN e-HEMTs. For example, a 100V, 90A GaN e-HEMT (GS61008T) may be provided in a top-side cooled laminated package which is about 7 mm×4 mm, and 0.54 mm thick; a 650V, 60A GaN e-HEMT (GS66516T) may be provided in a laminated package which is 9 mm×7.6 mm and 0.54 mm thick.

The dielectric polymer resin composition forming laminated packaging may include laminate sheets and layers of composite material referred to as prepreg, which is a substrate material, such as woven or non-woven glass-fiber cloth, that is pre-impregnated with one or more polymer materials, such as a dielectric epoxy composition. The dielectric epoxy composition may comprise an epoxy resin, curing agents, additives, such as fire retardants, and fillers and other substances to modify properties of the resulting composite material. One or more pre-cured epoxy laminate sheets and/or uncured prepreg layers are cut to form a cavity for the semiconductor die, and sandwiched between other uncured prepreg layers, i.e. assembled as a layer stack (i.e. layup), and the layers are then bonded together in a press, e.g. in a curing process using heat and pressure, to form a laminated dielectric body of the package in which the semiconductor die is embedded.

For power semiconductor devices, a typical embedded die package comprises low inductance electrical interconnect layers and conductive vias, e.g. formed from plated copper, and a thermal pad, also formed from plated copper. The outer layers of an embedded package comprise an isolation layer of solder resist (solder mask) which is a coating of a material that provides an electrically insulating and protective outer covering over the underlying dielectric and conductive layers, e.g. the solder resist layers cover the underlying layers including copper source, drain and gate interconnect traces, and openings are provided in the solder resist layer for the external source, drain and gate contact areas, and for the thermal pad.

GaN power switching devices, such as those mentioned above offered by GaN Systems Inc., which are embedded in a GaN$_{PX}$ type laminated package of small size, e.g. 7 mm×5 mm and 0.5 mm thick, are capable of operation at voltages in a range from 100V to 650V, for switching currents of tens or hundreds of Amps. Operating temperatures may reach or exceed 100 C. For small size dies having a high current capability per unit active area, and smaller package sizes, e.g. chip-scale packaging, package components are therefore subjected to higher electric fields and higher operating temperatures than for low voltage, lower power switching devices.

It is known that some dielectric materials are susceptible to degradation when subjected to high electric fields, especially at elevated operating temperatures. The above referenced U.S. patent application Ser. No. 16/380,318 discloses a methodology for selection of appropriate dielectric polymer compositions of the laminate (core) and pre-preg layers for embedded die packaging of power semiconductor devices operating at high voltage and high current. Another consideration is reliability issues encountered with conventional solder resist layers, which provide the external dielectric coating and protective layer of the package, with openings for the contact pads and thermal pad.

Both the epoxy pre-preg materials and solder resist typically include fillers, such as dielectric particles of as silicon dioxide ($SiO_2$) or alumina ($Al_2O_3$), to provide a high dielectric strength. The core and pre-preg layers of an embedded package are stacked and pressed in a multi-layer press, at elevated temperature, and under vacuum (i.e. in a vacuum lamination process), which substantially eliminates risk of bubbles and voids, and provides a package body with planar front and back surfaces. On the other hand, solder resist is typically applied as a coating by screen-printing and is therefore susceptible to formation of bubbles or voids, which can lead to reliability issues. Multilayer screen printing, e.g. two layers of solder resist, is conventionally used to improve coverage and reduce issues with bubbles or voids. Nevertheless, a screen-printed coating of solder resist is conformal, and regions where the solder resist extends over edges or corners or underlying metal interconnect may be more susceptible to mechanical, thermal and electrical stress and damage, leading to reliability issues.

This type of reliability issue with solder resist layers presents a particular challenge for embedded packaging of high voltage/high current lateral GaN e-HEMT power switches, that operate at high voltages and high temperatures, where high voltages combined with small geometry dies and packages result in package components being subject to higher electric fields and more extreme thermal cycling.

There is a need for improved or alternative embedded die packaging, particularly for high voltage/high current power semiconductor devices, such as GaN HEMTs, e.g., to provide improved reliability for high voltage and high temperature operation.

SUMMARY OF INVENTION

The present invention seeks to provides improved or alternative embedded die packaging for power semiconductor devices, and particularly for high voltage/high current wide-bandgap semiconductor power devices, e.g. GaN HEMTs and SiC power MOSFETS, which mitigate or circumvent at least one of the above-mentioned issues.

One aspect of the invention provides an embedded die package comprising a laminated body and a semiconductor device embedded within the laminated body, wherein inner conductive layers which provide interconnections to power terminals of the semiconductor device are isolated from external surfaces of the laminated body by a layer of dielectric having appropriate electrical and mechanical properties to withstand high electric fields. Thus, any external coating of solder resist is separated from underlying conductive metallization by the layer of high strength dielectric. The layer of dielectric is, for example, a pressed and cured dielectric layer, such as vacuum laminated dielectric, which is substantially void free. The layer of dielectric is preferably reinforced and has a coefficient of thermal expansion and mechanical strength that is better matched to other material of the package structure than a solder resist coating.

For example, an embedded die package comprises a laminated body and a die comprising a semiconductor power device, embedded within the laminated body, wherein:
the die comprises a patterned layer of conductive metallization on a front-side of the die providing first and second contact areas of the semiconductor power device, and a thermal contact area on a back-side of the die; and
a layer stack of the laminated body comprises:
a core comprising at least one dielectric layer which embeds the die;
a first dielectric build-up layer on a first side of the core;
a first conductive layer on the first dielectric build-up layer; the first conductive layer being patterned to define first and second interconnect areas;
the first and second interconnect areas of the first conductive layer being connected by electrically conductive vias to respective first and second contact areas on the die; and
an outer dielectric build-up layer extending over the first dielectric build-up layer and electrically isolating the first and second interconnect areas of the first conductive layer and separating the first conductive layer from an external surface of the laminated body.

For example, the power semiconductor device comprises one of: a power transistor device comprising first and second load contacts and a control contact; and a power diode device having first and second load contacts; wherein said first and second contact areas comprise contact areas for any two of said contacts.

For example, when the power semiconductor device comprises a power semiconductor transistor device, and said first and second load contacts and control contacts may be referred to as any one of: source, drain and gate; emitter, collector and gate; emitter, collector and base; source, collector and gate; anode, cathode and gate; and combinations thereof. When the power semiconductor device comprises a power semiconductor diode device, said first and second load contacts may be referred to as anode and cathode.

In example embodiments, an embedded die package comprises a laminated body and a die comprising a semiconductor power transistor embedded within the laminated body, wherein:
the die comprises a patterned layer of conductive metallization on a front-side of the die providing source, drain and gate contact areas of the semiconductor power transistor, and a thermal contact area on a back-side of the die; and
a layer stack of the laminated body comprises:
a core comprising at least one dielectric layer which embeds the die;
a first dielectric build-up layer on a first side of the core;
a first conductive layer on the first dielectric build-up layer; the first conductive layer being patterned to define source, drain and gate interconnect areas;
the source, drain and gate interconnect areas of the first conductive layer being connected by electrically conductive vias to respective source, drain and gate contact areas on the die; and
an outer dielectric build-up layer extending over the first dielectric build-up layer and electrically isolating the source, drain and gate interconnect areas of the first conductive layer and separating the first conductive layer from an external surface of the laminated body.

The external surface of the laminated body may comprise a coating of solder resist extending over the outer dielectric build up layer, the coating of solder resist being isolated from the underlying first conductive layer by the outer dielectric build-up layer For example, where the power semiconductor device comprises at least high voltage, high current lateral power transistor, such as a GaN HEMT, a SiC MOSFET or a Si IGBT rated for high voltage operation at an elevated temperature, the additional layer of dielectric isolates interconnect areas, e.g. source and drain contact areas, in regions subject to high electric field during operation. The power semiconductor device may be power diode, such as a GaN, SiC or Si diode. The die may comprise other components, e.g. driver and/or control circuitry integrated with the power semiconductor device, or the power semiconductor device may be co-packaged with other components embedded in the package. Where the power semiconductor device comprises a plurality of power transistors, these may be configured as a half-bridge, full bridge or other switching topologies.

For example, the at least one dielectric layer of the core and said first, second and outer dielectric build-up layers comprise any one of: a glass-fiber reinforced resin composition; a glass-fiber reinforced epoxy resin composition; a dielectric resin build-up layer; a dielectric epoxy build-up layer; a build-up layer which is formed from an ABF (Ajinimoto Build-up Film); and a combination thereof. The dielectric build-up layer may be a vacuum laminated dielectric For example, a vacuum laminated reinforced dielectric underlying the solder resist may be formed from an epoxy prepreg or a sheet of an epoxy resin composition comprising filler particles, known as a BUF (build-up film). The conductive layers and conductive vias may comprise copper.

The embedded die package may be configured for a die comprising a power semiconductor device which is e.g. a lateral GaN power transistor, or a SiC MOSFET or a Si IGBT, or a diode. For example, the power semiconductor transistor is a high voltage, high current lateral GaN HEMT rated for operation at ≥100V or ≥600V, and for operation at a temperature ≥75 C or ≥100 C.

The laminated body may comprise a layer stack which is symmetric or asymmetric, and may be configured with a top-side or bottom side thermal pad The core of the laminated body may optionally comprise a leadframe, e.g. a copper leadframe, supporting the die. The core and dielectric build-up layers may comprise a dielectric epoxy composition having an FR4 epoxy composition, such as Panasonic R1577 or Hitachi E679 or other composition having similar electrical and mechanical characteristics. The dielectric build-up layers may comprise a BUF polymer composition such as Sekishi NX04H, N!07, NQ07X or NR10. if the package includes a layer of solder resist (SR), the SR comprises e.g. Tayio AUS 320, D10ME or Hitachi FZ-2700GA.

In a first embodiment, an embedded die package comprises a laminated body and a die comprising a semiconductor power transistor embedded within the laminated body, wherein:
the die comprises a patterned layer of conductive metallization, e.g. Cu RDL, on a front-side of the die providing electrical contact areas for source, drain and gate of the semiconductor power transistor, and a thermal contact area on a back-side of the die; and
a layer stack of the laminated body comprises:
  a core comprising at least one dielectric layer which embeds the die;
  a first dielectric build-up layer on a first side of the core;
  a first conductive layer on the first dielectric build-up layer;
  a second dielectric build-up layer on a second side of the core;
  a second conductive layer on the second dielectric build-up layer;
  a third dielectric build-up layer on the first conductive layer;
the first conductive layer being patterned to define source, drain and gate interconnect areas;
the second conductive layer being patterned to define source, drain and gate interconnect areas and a thermal pad;
the source, drain and gate interconnect areas of the first conductive layer being connected by electrically conductive vias to respective source, drain and gate contact areas on the die;
the source, drain and gate interconnect areas of the first conductive layer by electrically conductive vias to respective source, drain and gate interconnect areas of the second conductive layer;
the thermal pad of the second conductive layer being connected by thermal vias to the thermal contact area on the back-side of the die;
and
the third dielectric build-up layer extending over the first dielectric build-up layer and electrically isolating the source, drain and gate interconnect areas of the first conductive layer and separating the first conductive layer from an external surface of the laminated body.

The embedded die package may comprise at least one of: a coating of solder resist on the second build-up layer having openings to the source, drain and gate contact areas of the second conductive layer and the thermal pad of the second conductive layer; and a blanket coating of solder resist on the third dielectric build-up layer.

To provide a symmetric layup structure, in a second embodiment the layer stack of the laminated body further comprises:
a fourth dielectric build-up layer on the second conductive layer;
a third conductive layer on the fourth dielectric build-up layer, the third conductive layer being patterned to define external source, drain and gate contact pads and an external thermal pad;
the source, drain and gate interconnect areas of the second conductive layer being connected by electrically conductive vias to respective external source, drain and gate contact pads of the third conductive layer; and the thermal pad of the second conductive layer being connected by thermal vias to the external thermal pad of the third conductive layer.

The embedded die package may comprise a solder resist coating, e.g. at least one of: a coating of solder resist on the third build-up layer having openings to the external source, drain and gate contact pads of the third conductive layer and the external thermal pad of the third conductive layer; and a blanket coating of solder resist on the third dielectric build-up layer.

The conductive vias interconnecting source, drain and gate interconnect areas of the first and second conductive layers may be copper filled vias that extend through the core and the first and second dielectric build-up layers.

Where the core comprises a leadframe embedded within the core and surrounding the die, and the leadframe provides electrically conductive interconnections through at least part of a thickness of the core to said conductive vias interconnecting source, drain and gate interconnect areas of the first and second conductive layers.

For example, a leadframe may be embedded within the core, supporting the die, the leadframe providing said second conductive layer comprising the source, drain and gate interconnect areas and the thermal pad of the second conductive layer, the leadframe provides electrically conductive interconnections through at least part of a thickness of the core to said conductive vias interconnecting source, drain and gate interconnect areas of the first and second conductive layers, and the thermal pad of the leadframe is in thermal contact with the thermal contact area on the back-side of the die.

In a third embodiment, an embedded die package comprises a laminated body and a die comprising a semiconductor power transistor embedded within the laminated body, wherein:

the die comprises a patterned layer of conductive metallization on a front-side of the die providing electrical contact areas for source, drain and gate of the semiconductor power transistor, and a thermal contact area on a back-side of the die; and a layer stack of the laminated body comprises:
  a core comprising at least one dielectric layer which embeds the die;
  a first dielectric build-up layer on a first side of the core;
  a first conductive layer on the first dielectric build-up layer;
  a second dielectric build-up layer on a second side of the core;
  a second conductive layer on the second dielectric build-up layer;
  a third dielectric build-up layer on the second conductive layer;
  a third conductive layer on the third dielectric build-up layer;

the first conductive layer patterned to define internal source, drain and gate interconnect areas;
the second conductive layer being patterned to define a thermal pad;
the third conductive layer patterned to define external source, drain and gate pads;
the internal source, drain and gate interconnect areas of the first conductive layer connected by electrically conductive vias to respective source, drain and gate contact areas on the die, and connected by electrically conductive vias to the external source, drain and gate pads of the third conductive layer; and
the thermal pad of the second conductive layer being connected by thermal vias to the thermal contact area on the back-side of the die.

The latter embodiment is an example of an embedded die package configures with a top-side thermal pad, i.e. the thermal pad is on the opposite side to the source, drain and gate contact pads. The embedded die package may comprise a solder resist coating, e.g. at least one of: a coating of solder resist on the third dielectric build-up layer patterned with openings for the external source, drain and gate pads; and a coating of solder resist coating on the second dielectric build-up layer patterned with an opening for the thermal pad.

To provide a symmetric layup, the laminated body further comprises:
a fourth dielectric build-up layer on the second conductive layer; and
a fourth conductive layer on the fourth dielectric build-up layer;
the fourth conductive layer being patterned to define an external thermal pad; and
the external thermal pad of the fourth conductive layer being connected by thermal vias to the thermal pad of the second conductive layer.

Thus, embodiments of the invention provide for improvements in embedded die packaging for power semiconductor devices, and particularly for high voltage and high current power switching devices, e.g. comprising GaN HEMTs, SiC MOSFETs and Si IGBTs, which operate at elevated temperatures, e.g. for improved device performance and reliability.

BRIEF DESCRIPTION OF THE DRAWINGS

FIG. 4 (Prior Art) shows an example cross-sectional view of a layer stack (layup) of a typical embedded die package for a die comprising a lateral power transistor;

FIG. 5A (Prior Art) shows an enlarged cross-section view of region A of FIG. 4; and FIG. 5B (Prior Art) shows schematically an example of how solder resist layer may provide a non-uniform conformal coating over an edge of a conductive metal trace;

FIG. 6A shows a schematic view of an example of a GaN-on-silicon die comprising a lateral GaN power transistor, and FIG. 6B shows a schematic cross-sectional view;

FIG. 7 shows a schematic cross-sectional view of a layer stack (layup) of an embedded die package 100 of a first embodiment;

FIG. 9 shows a cross-sectional view of a layer stack (layup) for a 4-copper layer PCB process and FIG. 10 shows a cross-sectional view of a layer stack (layup) for a 6-copper layer PCB process;

FIG. 11 (Prior Art) shows a conventional layer stack for a conventional GaNPx type package with bottom-side thermal pad;

FIG. 12 (Prior Art) shows a conventional layer stack for a conventional GaNPx type package with top-side thermal pad;

FIG. 13 shows a layer stack for a GaNPx type package 300 of a third embodiment with a bottom-side thermal pad;

FIG. 14 shows a layer stack for a GaNPx type package 400 of a fourth embodiment with a top-side thermal pad;

The foregoing and other features, aspects and advantages of the present invention will become more apparent from the following detailed description, taken in conjunction with the accompanying drawings, of example embodiments of the invention, which description is by way of example only.

DETAILED DESCRIPTION

Figure 1:
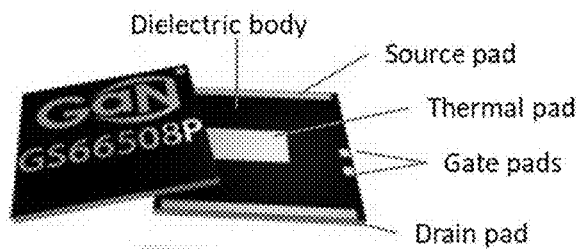
FIG. 1 (Prior Art) shows schematic views of an example of an E-mode lateral GaN HEMT device structure embedded in a laminated epoxy package with a bottom-side thermal pad.
Figure 2:
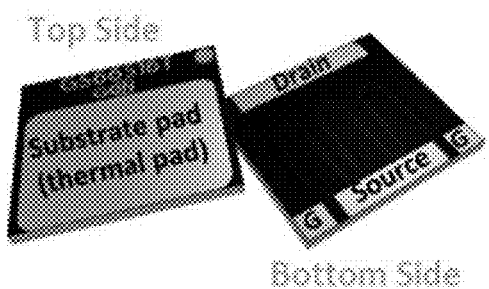
FIG. 2 (Prior Art) shows schematic views of another example of an E-mode lateral GaN HEMT device structure embedded in a laminated epoxy package with top-side thermal pad.

Examples of embedded die packaging device structures comprising a laminated dielectric package body containing a lateral GaN power transistor are shown schematically in FIGS. 1 and 2 (Prior Art). FIG. 1 shows top-side and bottom-side views of a first example of a package comprising an embedded GaN-on-Si die comprising a 650V lateral GaN e-HEMT. The back (bottom) side of the package comprises a thermal pad, and source, drain and gate contact pads. FIG. 2 shows top-side and bottom-side views of another example of a package comprising an embedded GaN-on-Si die comprising a lateral GaN e-HEMT. The front (top) side of the package comprises a thermal pad. Source, drain and gate pads are provided on a back-side of the package.

Figure 3:
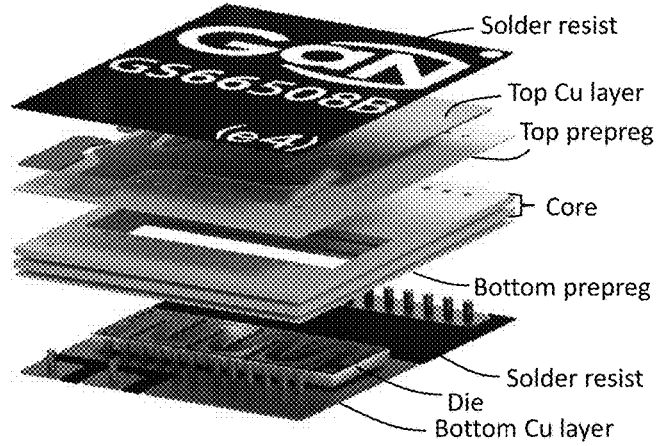
FIG. 3 (Prior Art) shows a schematic exploded view of another example of an E-mode lateral GaN HEMT device structure embedded in a laminated epoxy package with bottom-side thermal pad, to illustrate the laminated multi-layer structure of an example GaNPx type embedded package.

FIG. 3 shows a schematic exploded view of the components of an example package, to illustrate how the GaN-on-silicon die is embedded within a dielectric body of the package. The dielectric body comprises an epoxy composition fabricated from laminations comprising several epoxy laminate and prepreg layers (light green) and conductive copper layers (copper coloured). The GaN die comprises a thick copper redistribution layer (RDL) on the die, defining large area source, drain and gate contact areas. Other components comprise low inductance conductive copper interconnects comprising copper filled vias, copper filled micro-vias, and external source, drain and gate pads on a bottom-side of the package. Copper filled thermal vias provide thermal contact between a back-side of the GaN die and a thermal pad on the bottom side of the package.

FIG. 4 shows a simplified schematic cross-sectional view through a typical embedded die package showing the embedded die and layers of the package body comprising a layer stack (layup) of dielectric layers and conductive layers. For example, the dielectric layers comprise a core of a glass-fiber reinforced FR4 epoxy dielectric layer (light green coloured) and upper and lower fiber reinforced dielectric layers, e.g. formed from FR4 epoxy prepreg (darker green coloured). The top and bottom conductive layers are plated copper interconnect layers which are interconnected with plated copper filled conductive vias and micro-vias (copper coloured). The thermal pad and thermal vias are also formed from plated copper.

The fabrication process for this type of embedded component package is based, for example, on the AT&S ECP® or Centre Core ECP® processes. The package is fabricated by placing each GaN die in a cavity or opening in the core, which may comprise one or more epoxy laminate layers (cured or partially cured), applying top and bottom prepreg layers (uncured), and pressing and thermally curing the epoxy laminate composition in a vacuum lamination process, so that the GaN die is embedded in a solid dielectric body. During lamination, the uncured epoxy is heated so it softens and flows to fill any remaining spaces, and then it is heated to a curing temperature. The prepreg layers comprise top and bottom thin copper foil layers which act as a seed layer for copper plating. The electrical connections to the GaN die are formed in subsequent steps, e.g. by drilling micro-vias and through-substrate vias, which are then filled with plated copper, to provide low inductance electrical interconnections. The copper foil layers are also plated with copper to increase the copper thickness to form electrically conductive interconnect layers. In the example embedded die shown FIG. 4, the top copper layer is patterned to define source and drain interconnect area, and the bottom copper layer is patterned to form source and drain and pads, and a thermal pad. (Gate connections are also provided by the copper layers and conductive vias, but are not shown in the simplified schematic in FIG. 4). Copper filled micro-vias act as thermal vias to provide a thermal connection from the back-side of the die to the thermal pad. The top and bottom external surfaces of the package are coated with a layer of solder resist with openings for the contact pads and thermal pad. The solder resist is a thin coating of screen-printed dielectric material, which also forms a protective external coating, e.g., to protect underlying layers against oxidation and during solder reflow.

Package design considerations for low inductance interconnect and thermal dissipation are well understood, and the thermo-mechanical properties of epoxy materials systems for laminated packaging are well characterized, by industry standard test methods, so that appropriate epoxy materials can be selected based on parameters such as Tg, CTE, et al., that are reported on materials specification sheets. Thus, appropriate epoxy laminates and prepregs for laminated packaging may be selected based on these parameters, e.g. to optimize thermal and mechanical performance. The specified parameters may include electrical parameters including dielectric constant (Dk) and dissipation factor (Df) at a specified frequency or frequencies, resistivity, and surface resistance.

It will also be apparent that, for a specified operating voltage and operating temperature, in practice, the electric field experienced by the dielectric material of the package is dependent on, or influenced by, factors such as the size and geometry of the package body, and the size and layout of the die and conductive interconnect structure.

Since these embedded die packages are small in size, e.g. ~10 mm×~5 mm and about 0.5 mm thick, for packaging of power transistors, e.g. lateral GaN HEMTs rated for operation at high voltages, e.g. at 100V or 650V, the dielectric body of the package is subjected to high electric fields during operation, e.g. in a range of ~$10^3$V/cm to $10^5$V/cm.

For example, FIG. 5A shows an enlarged view of the region A of FIG. 4, which is the region where parts of the source interconnect metal and drain interconnect metal are in close proximity, laterally separated only by the solder resist coating. Thus, this region is subject to high electric field during operation, e.g. 650V over a distance of a few hundred microns separation between the source metal and drain metal. Although the solder resist coating is a dielectric, it is typically applied as a conformal coating by screen printing, which may result in bubbles or void. As shown in FIG. 5B the conformal solder resist coating may be non-uniform, e.g. thinner over edges of conductive traces.

It is recognized that a coating of solder resist may be susceptible to cracking due to thermal cycling, which reduces long term reliability. For example, laminated FR4 dielectrics have an alpha-1 CTE value of ~15 ppm/C and copper is about 17 ppm/C, so the mechanical properties of these layers are well matched. By comparison, solder resist has a CTE of ~60 ppm. The high CTE and low strength of solder resist is a poor match to other materials of the package, so the solder resist has inferior mechanical properties and is a weaker part of the package. If a crack is formed in a region of high electric field, where the solder resist is acting as a dielectric, a short, breakdown, or burnout is possible. A process related bubble or void in a high electric field region of the solder resist may result in the same type of failure. When the solder resist coating cracks due to temperature cycling, with further temperature cycling a crack in the solder resist can propagate down into the layer stack, e.g. into the FR4 dielectric layers, eventually reaching the die or other internal conductive layers, resulting in an electrical breakdown. The solder resist in the region where the crack was initiated may be acting as a dielectric (i.e. in regions of high electric field) or other regions the solder resist may be acting primarily as a protective layer rather than a dielectric layer (e.g. in regions of low electric field). In the latter case, if the crack propagates through to other layers, an initial mechanical failure of the solder resist can lead to an eventual electrical failure.

An example GaN die 10 is illustrated schematically in FIGS. 6A and 6B, and comprises a high voltage, high current lateral GaN HEMT fabricated on a silicon substrate (e.g. see above referenced patents and patent applications). The die 10 comprises source, drain and gate contact areas defined by a low inductance, thick copper redistribution layer (Cu-RDL) on the front-side, and a back-side layer of conductive metallization (back-side metal). In GaNPx type embedded packages, the front-side Cu-RDL provides electrical contacts. For example, as illustrated schematically in FIGS. 6A and 6B, the Cu-RDL defines large area source and drain contact areas (source and drain pads) with interdigitated extensions (e.g. tapered portions or fingers), and dual gate contact areas (gate pads). The back-side metallization, which is thermally and electrically conductive, provides for thermal contact through thermal vias to the thermal pad, and also allows for a back-side source connection, if required. In the following description, references to "front-side" and "back-side" are with respect to the GaN die, as indicated in FIGS. 6A and 6B, i.e. wherein the substrate side of the die is the back-side and the active area of the lateral GaN transistor and its source, drain and gate contacts are provided on the front-side of the die; and references to "top" and "bottom" are with respect to the package, as it would be mounted on a substrate, such as a support surface of a power module or PCB. For example, in the embedded die package of this example the external source, drain and gate pads are on the same surface (bottom) of the package that is to be mounted on the substrate surface. Customarily, this configuration may be referred to as having a bottom side thermal pad, and the terms "top" and "bottom" are not intended to limit the orientation of the package as it would be surface mounted for operation.

An embedded die package 100 of a first example embodiment is shown in FIG. 7. As illustrated schematically in FIG. 7, the power semiconductor die 10, e.g. a GaN die as illustrated in FIG. 6, is embedded within a core structure 110 comprising one or more core layers, e.g. one or more layers of dielectric laminate, such as an FR4 laminate. The core structure is sandwiched between a first (front-side) dielectric build-up layer 120-1, and a second (back-side) dielectric build-up layer 120-2. A first conductive copper layer 130-1 comprising plated copper, is provided on the first (front-side) dielectric build-up layer 120-1 and patterned to define source metal interconnect portions 132-1 and drain metal interconnect portions 134-1, and gate interconnect portions (not shown in this view). The source metal interconnect 132-1 and drain metal interconnect 134-1, and gate interconnect are interconnected to respective source and drain areas, and gate areas of the Cu-RDL on the GaN die by copper filled conductive micro-vias 140. A second conductive copper layer 140-2 comprising plated copper, is provided on the second (back-side) build-up layer 130-2 and patterned to define source portion 132-2, drain portion 134-2, gate portion (not shown) and a thermal pad area 180-2. Conductive vias 150 comprising plated copper provide interconnections between the source and drain portions 132-1 and 132-2 of first conductive copper layer 130-1 and respective source and drain portions 132-2 and 134-2 of second conductive copper layer 130-2. The conductive vias 150 extend through the dielectric core structure 110, and through the first (front-side) dielectric build-up layer 120-1, and the second (back-side) dielectric build-up layer 120-2. The thermal pad 180-2 is thermally connected to the back-side of the GaN die by copper filled thermal micro-vias 170. As mentioned above, the back-side of the GaN die may comprises a layer of conductive metallization, that provides for good thermal contact with the die substrate and, if required allows for a back-side source connection. Gate interconnections (not shown in this view) are also provided. A third (front-side) dielectric build-up layer 120-3 is provided on the first copper layer 130-1. After forming the conductive vias 140 and 150, and thermal vias 170, the source and drain interconnect areas, 132-2 and 134-2, and thermal pad 180-2, a fourth (back-side) dielectric build-up layer 120-4 is provided on the back-side of the layer stack. Micro-vias are laser drilled through the fourth dielectric build-up layer 120-4 to contact respective areas of the source, drain, gate portions of the second conductive layer 130-2 and the thermal pad 180-2 defined by the second conductive layer 130-2. A copper plating process is then performed to fill the drilled vias and form the electrically conductive vias and thermal vias, and to build up the thickness of the third copper layer 130-3 to a required thickness. The third copper layer 130-3 is patterned to define an external source pad 132-3, drain pad 134-3 and thermal pad 180-3, and a gate pad (not shown in this view). A patterned coating of solder resist 190 is provided on the back-side, as is conventional, with openings to the source pad 132-3, drain pad 134-3, gate pad, and the thermal pad 180-4. A blanket coating of solder resist 192 is provided on the front-side on the third build-up layer 120-3. The solder resist layer 192 is separated from the first conductive metal layer 130-1 by the third build-up layer 120-3, and the third build-up layer fills region 122, which, in operation is a high electric field region between the source interconnect metal 132-1 and drain interconnect metal 134-1. Thus, the third build-up layer 120-3 acts as an outer dielectric build-up layer that embeds and electrically isolates closely spaced regions of the source interconnect metal 132-1 and drain interconnect metal 134-1 from an external surface of the laminated body.

For example, the core structure and the first, second, third and fourth build-up layers may be FR4 type dielectric materials. The core structure may comprise one thick layer of FR4 laminate that is partially or fully cured and has an opening or cavity cut out to accommodate the GaN die, or the core structure may comprise a stack of several layers of partially cured laminate, with cut out areas for the GaN die, that can be bonded together and cured in the lamination process. The laminate layers may include a woven or non-woven glass fiber cloth and an epoxy composition which includes filler particles. The build-up layers are uncured or partially cured layers of a compatible FR4 epoxy composition.

The laminate layers of the core structure and the build-up layers are not limited to FR4 type materials, and may be any suitable laminate layers, prepreg layers or alternative build-up layers, that can be stacked and pressed in a vacuum lamination process using pressing and heat, to bond the layers, embed the GaN die, and provide a structure in which the front- and back-sides are planar surfaces. In some example embodiments, the laminate layer of the core, and the build-up layers may be fiber reinforced, e.g. contain woven or non-woven glass fiber cloth impregnated with an epoxy composition or other dielectric polymer composition, which may be referred to as pre-preg or prepreg. In other embodiments, the laminate layers or build-up layers comprise particles of dielectric filler, but do not include fibers. In other example embodiments, the build-up layers may be BUF (Build-up films) of a filled epoxy composition, or another type of filled dielectric resin composition, or a particular type of BUF referred to as Ajinomoto build-up films (ABF).

By way of example only, in one example embodiment, the core structure comprises an FR4 type fiberboard, e.g. a Hitachi R1577 or Hitachi E679 epoxy laminate fiberboard, having a thickness equal to or greater than the thickness of the GaN die to be embedded, with a cavity cut in the laminate to accommodate the GaN die. The first, second, third and fourth build-up layers comprise compatible epoxy prepreg layers, e.g. Hitachi R1570, E-770G or E-679. Thin copper foil layers are typically provided on each dielectric build-up layer, to allow for copper plating to form conductive layers. If a conductive layer is not required, the copper foil is removed before the next step to provide another build-up layer. A series of layup and pressing steps, i.e. one or more steps of vacuum lamination in a press at elevated temperature, is used to form a solid dielectric body, comprising the core structure 110 and first, second, third and fourth dielectric layers 120-1, 120-2, 120-3 and 120-4, with drilling of micro-vias and vias, and copper plating steps to form electrically conductive vias, thermal vias and the first, second and third copper layers 130-1, 130-2 and 130-3, for the conductive interconnect layers. The conductive interconnect layers are patterned to define internal conductive interconnect traces, and to define external electrical contact pads and the thermal pads. That is, in this embodiment, the external source, drain and gate contact pads and the thermal pad of the package are all provided on the back-side, relative to the GaN die (which in this configuration is generally referred to as the bottom side of the package).

In the resulting embedded die package having a structure as shown in FIG. 7, the solder resist coating is separated from underlying conductive metal interconnect by the laminated layer of dielectric 120-3, which provides a more robust dielectric in regions of high electric field, e.g. region 122 between the source interconnect metal 132-1 and drain interconnect metal 134-1. Separating the conventional external/outer layers of solder resist from the underlying conductive metal layer by a vacuum laminated dielectric layer provides a layer with both superior dielectric and mechanical characteristics (relative to a conventional solder resist coating) overlying the source and drain metal interconnect layers, particularly in regions which are subjected to high electric field during operation, such as region 122 between the source and drain interconnect metal.

The above referenced U.S. patent application Ser. No. 16/380,318 provides a methodology for selecting dielectric materials for embedded packaging of high current/high voltage power semiconductor devices based on parameters comprising a conductivity transition temperature $T_c$. As an example, from a small sample of materials that are commonly used for embedded die packages, two samples were found to provide superior performance for high current/high voltage operation at elevated operating temperatures, e.g. rated for operation ≥100 C. Other dielectric materials with comparable or superior dielectric performance may be selected.

Selection of appropriate dielectric compositions for the laminated dielectric layers for laminated packages, e.g. glass-fiber reinforced epoxy compositions or filled epoxy compositions comprising dielectric particle fillers, enables more reliable high voltage operation (≥100V, or ≥600V) at higher operating temperatures (e.g. ≥100 C), to assist in achieving a long lifetime without performance degradation, even with small geometry layouts and small package sizes. By way of example only, a suitable FR4 material may comprise Panasonic R1577 laminate (FR4 fiberboard) and R1570 prepreg, or Hitachi E679 laminate and prepreg; these materials comprise glass fiber/epoxy compositions. Examples of BUF and ABF are Sekisui NX04H, NQ07, NQ07X and NR10. Examples of solder resist are Taiyo AUS320, D10ME or Hitachi FZ-2700GA. Other suitable materials may be selected.

Figure 8:
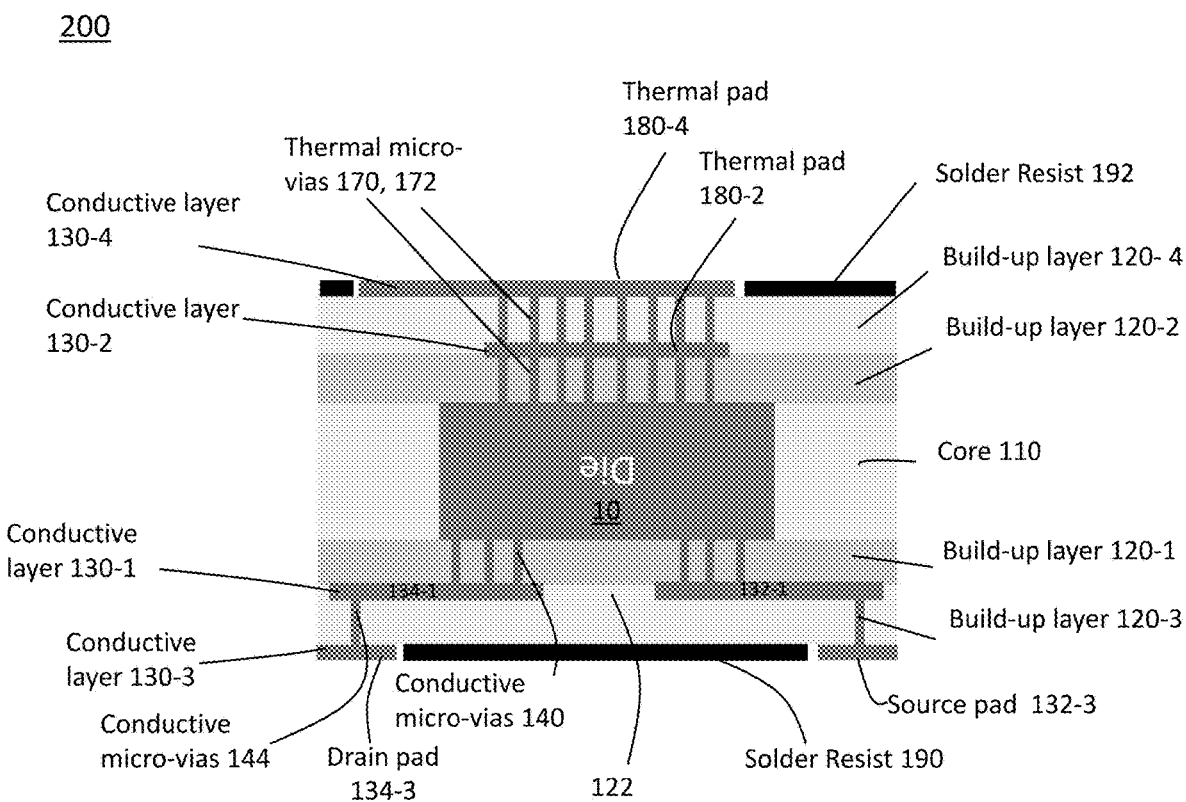
FIG. 8 shows a schematic cross-sectional view of a layer stack (layup) of an embedded die package 200 of a second embodiment.

An embedded die package 200 of a second example embodiment is shown in FIG. 8. In this embedded die package, the thermal pad is provided on one side of the package and the source, drain and gate contact pads are provided on the other side. Elements of the embedded die package 200 that are similar to elements of the embedded die package 100 shown in FIG. 7 are labelled with the same reference numerals. Thus, the package 200 comprises a core structure 110, and first, second, third and fourth dielectric build-up layers 120-1, 120-2, 120-3 and 120-4. A first conductive layer 130-1 is provided between the first and third dielectric build-up layers 120-1 and 120-3 and patterned to define source interconnect 132-1 and drain interconnect 134-1, connected by conductive vias 140 to respective contact areas the front-side of the die 10. A second conductive layer 130-1 of plated copper is patterned to define thermal pad 180-2 on the back-side. A third conductive layer 130-3 is provided on the third dielectric build-up layer 120-3 and patterned to define external source pad 132-3 and external drain pad 134-3, which are interconnected by conductive vias 144 to underlying interconnect metal. (For simplicity, gate interconnections are not shown in FIG. 8). A fourth conductive layer 130-4 is provided on the fourth build-up layer 120-4 and patterned to define external thermal pad 180-4. Thermal vias 170 and 172 provide thermal connections between thermal pads 180-2, 180-4 and the back-side of die 10. A solder resist coating 190 is provided on the front-side with openings to the source, drain and gate contact pads. A solder resist 192 coating is provided on the back-side with an opening exposing the external thermal pad 180-4. The third dielectric build-up layer 120-3 provides a more robust dielectric and mechanical structure, particularly in regions that are subject to a high electric field during operation, e.g. region 122, between source and drain interconnect traces 132-1 and 134-1. In this region, the solder resist layer 190 is separated from the region 122 by the third dielectric build-up layer 130-3. This layer stack of embedded die package 200 of this embodiment comprises a core, two build-up layers on each side of the core, and four conductive metal layers, i.e., two conductive layers on each side of the core.

A conventional layer stack for an embedded die package such as shown in FIG. 4 comprises a core, one build-up layer on each side of the core, and one conductive metal layer on each side of the core. The layer stack of embedded die package 100 of the first embodiment comprises a core, two build-up layers on each side of the core, and three conductive metal layers, i.e., one conductive layer on the front-side and two conductive layers on the back-side. The layer stack of embedded die package 200 of the second embodiment comprises a core, two build-up layers on each side of the core, and four conductive metal layers, i.e., two conductive layers on each side of the core. While the additional layers add processing steps and cost to fabrication, the resulting structure provides a more robust dielectric and mechanical structure, e.g. for packaging of high current high voltage power transistors for improved long-term reliability.

Fabrication of embedded die packaging of example embodiments is based modifications of PCB fabrication technology. For example, FIG. 9 shows a conventional 4-layer copper PCB layup (layer stack), and FIG. 10 shows a conventional 6-layer copper PCB layup. Layups for embedded die package of example embodiments may be symmetrical or asymmetrical about a core layer.

Referring to FIG. 11 and FIG. 12, in fabrication of a GaNPx type embedded package for a GaN power transistor, such as illustrated in FIGS. 6A and 6B, the middle copper layers of a 4-layer PCB layup are removed. The on-chip Cu-RDL defining source, drain and gate contact areas on the front-side, and a back-side metal layer for thermal contact, effectively provide the inner conductive layers on each side of the die. Corresponding elements for the structures of example embodiments shown in FIGS. 11, 12, 13 and 14 are numbered with corresponding reference numerals as for the embodiments described above with reference to FIGS. 7 and 8. As shown in FIG. 13 and FIG. 14, the middle copper layers of a 6-layer PCB layup are removed, because the on-chip RDL on the front-side, and back-side metal, provide inner conductive layers on each side of the die. FIG. 13 shows an embedded die package of a third embodiment 300, which is a variant of that shown in FIG. 7. FIG. 14 shows an embedded die package of an embodiment 400 which is a variant of that shown in FIG. 8. In FIGS. 7 and 8 the core structure has a thickness which is substantially the same as the thickness of the die. In FIGS. 13 and 14 the core structure has a thickness which greater than the thickness of the die, so that the die is separated by thickness 111 from the adjacent dielectric build-up layer, i.e. the dielectric layer structure of the core is not entirely symmetric. In comparison, in FIGS. 7 and 8, the die is centered in the core structure, sandwiched between the dielectric build-up layers.

Figure 15:
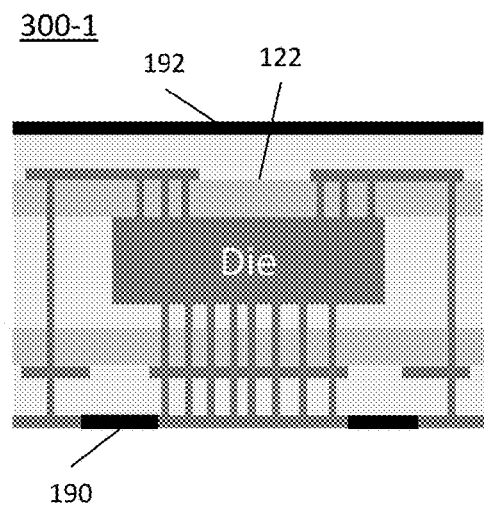
FIGS. 15 to 21 show embedded die packages of other example embodiments.
Figure 16:
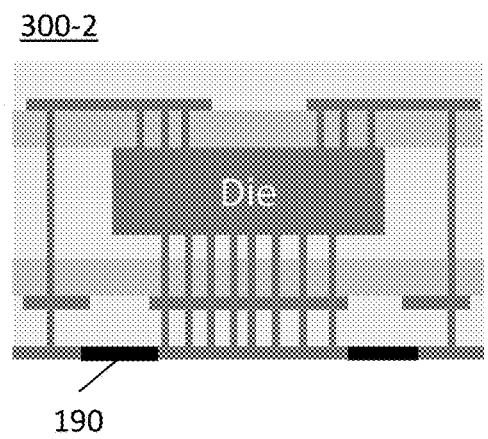
Figure 17:
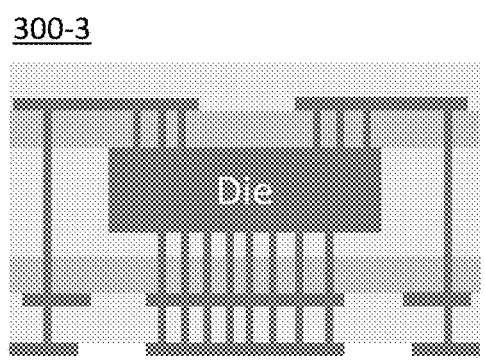
Figure 18:
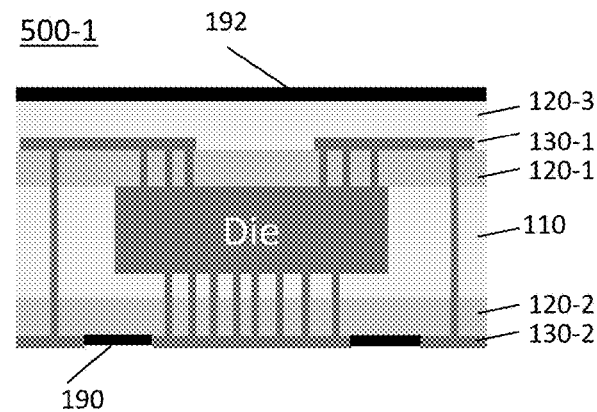
Figure 19:
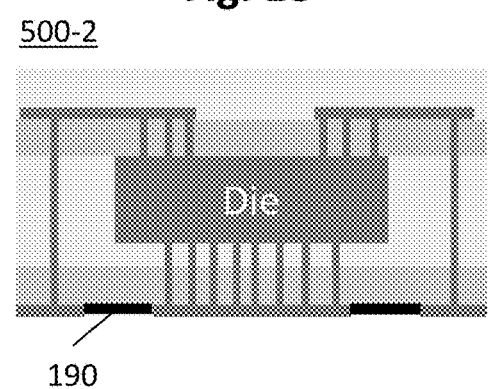
Figure 20:
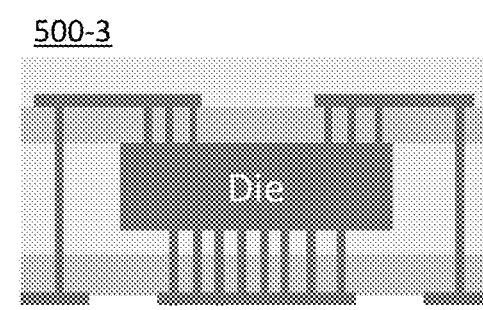
Figure 21:
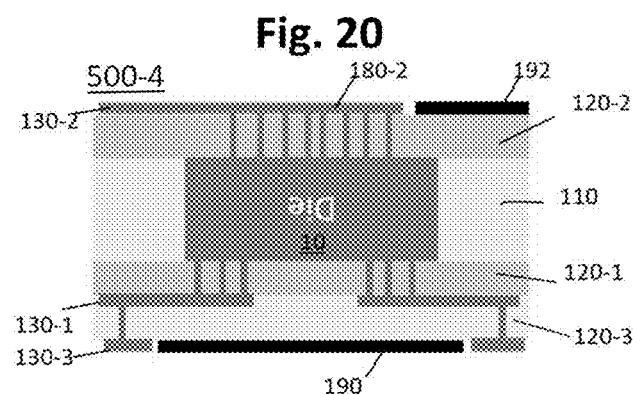

FIGS. 15 to 21 shows some embedded die packages of other example embodiments which are variants of the embodiments described in detail above. FIG. 15 shows an embedded die package of an embodiment 300-1, which is similar to that shown in FIG. 12, having a solder resist coating provided on each side of the package, i.e. solder resist 192 on the front side and solder resist 190 on the back-side. FIG. 16 shows an embedded die package of an embodiment 300-2, in which a solder resist layer 190 is provided only on the back-side of the package, and not on the front side of the package. The solder resist 190 on the back-side may be required as a dielectric and protective layer, e.g. during solder reflow. However, the solder resist on the front-side may not be required as a dielectric coating because the third build-up layer 120-3 completely covers the interconnect metal of the conductive layer 130-1. If a coating of solder resist is provided on the front, as shown in FIG. 15, the surface of the build-up dielectric layer 120-3 is flat, so a uniform blanket coating of solder resist 192 can be provided, and the solder resist is separated from the high electric field region 122 between source and drain interconnect metal. FIG. 17 shows a package 300-3 in which solder resist is omitted from both sides of the package. The embedded die package 500-1 shown in FIG. 18 comprises an asymmetric layup, which includes two build-up layers 120-1 and 120-3 on the front-side of the core 110 and only one build-up layer 120-2 on the backside of the core, and only two conductive metal layers 130-1 and 130-2. That is, in comparison with the embedded die package shown in FIG. 7, the fourth build-up layer 120-4 and third metal layer 130-3 are omitted, to provide a simplified structure. Solder resist 190 and 192 is provided on both sides of the package. FIG. 19 shows a package structure 500-2 of an embodiment comprising a solder resist coating on only one side. In the package structure 500-3 of the embodiment shown in FIG. 20 solder resist is omitted from both sides of package. FIG. 21 shows a package structure 500-4 of an embodiment comprising an asymmetric layup with a top-side thermal pad, having two build-up layers 120-1 and 120-3 on the front side of the die and one build-up layer 120-2 on the back-side of the die, and three metal layers 130-1, 130-2 and 130-3. That is comparing the embodiments shown in FIG. 8 and FIG. 21, the structure shown in FIG. 8 comprises additional layers, i.e. buildup layer 120-4 and conductive layer 130-4 on the top side.

Figure 22:
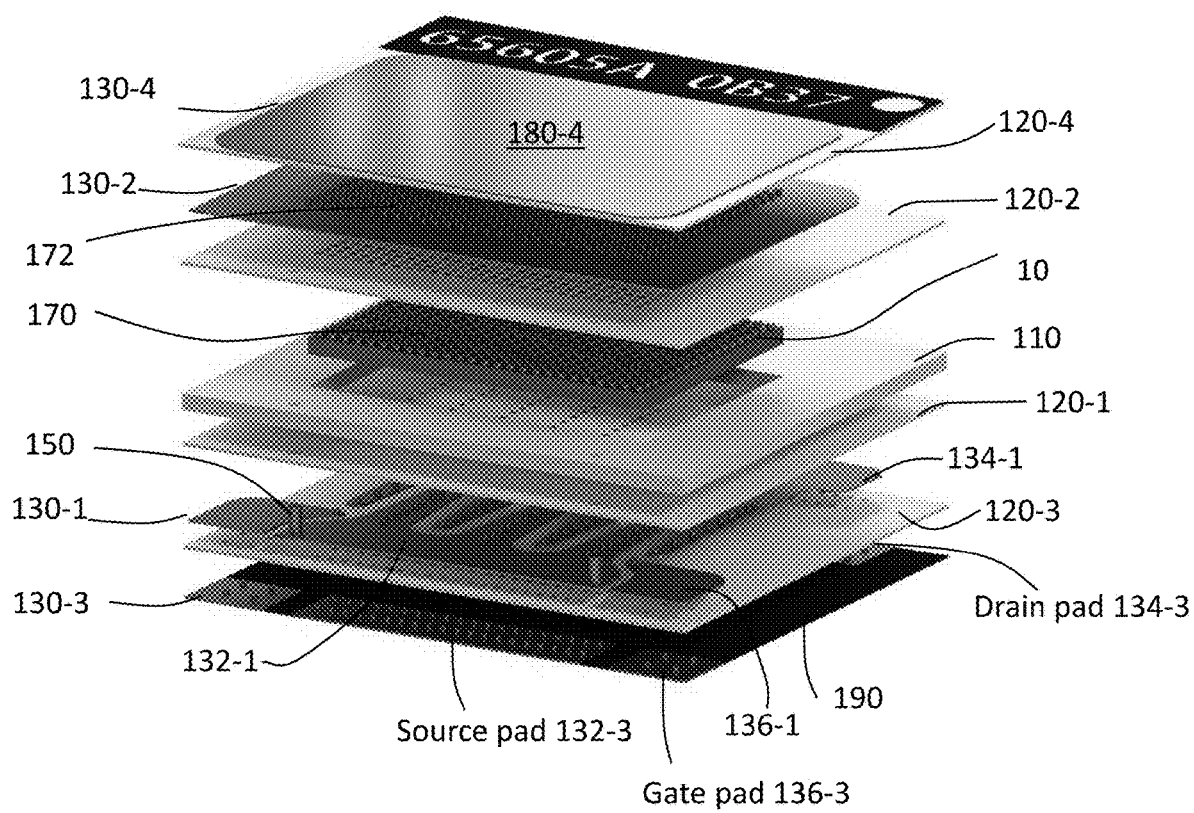
FIG. 22 shows an exploded view of components of an embedded die package 600 of a sixth embodiment.

FIG. 22 shows an example of a schematic exploded view of components of an embedded die package 600 of a sixth embodiment, in which source, drain and gate pads are provided on one side of the package body and the thermal pad is on the opposite side. Corresponding elements of the package of this embodiment are labelled with the same reference numerals as the package of the embodiment illustrated schematically in FIG. 8. The structure shown in FIG. 22 provides a schematic representation of the layer structure and relative dimensions of the elements of an embedded die package comprising 650V GaN HEMT. In this view, the GaN die is oriented back-side up, and thermal vias 170 and 172 provide thermal contact with the thermal pad which is formed from metal layers 130-2 and 130-3. As illustrated, the fourth (top) metal layer 130-4 provides a large area thermal pad 180-4 on the top of the package. The first conductive layer 130-1 is patterned to provide source, drain and gate contact areas, 132-1, 134-1 and 136-1 respectively, with conductive micro-vias for connection to respective source, drain and gate areas of the Cu RDL on the die. At the bottom, the third metal layer 130-3 is patterned to define external source pad 132-3, external gate pad 136-3 and external drain pad 134-3, which are also interconnected by conductive vias to respective source, drain and gate contact areas of the underlying interconnect metal. Conductive vias 150 provide for connection of the thermal pad to source.

Figure 23:
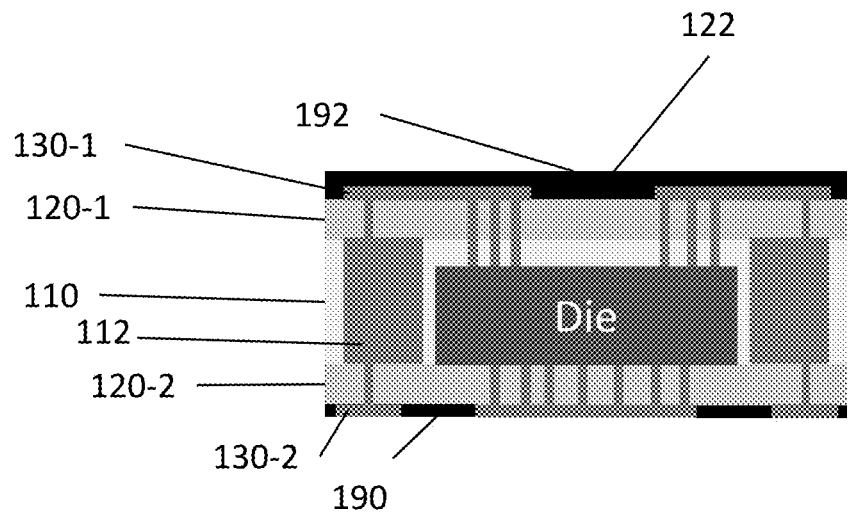
FIG. 23 (Prior Art) shows a conventional layer stack for a leadframe type embedded die package with bottom-side thermal pad.
Figure 24:
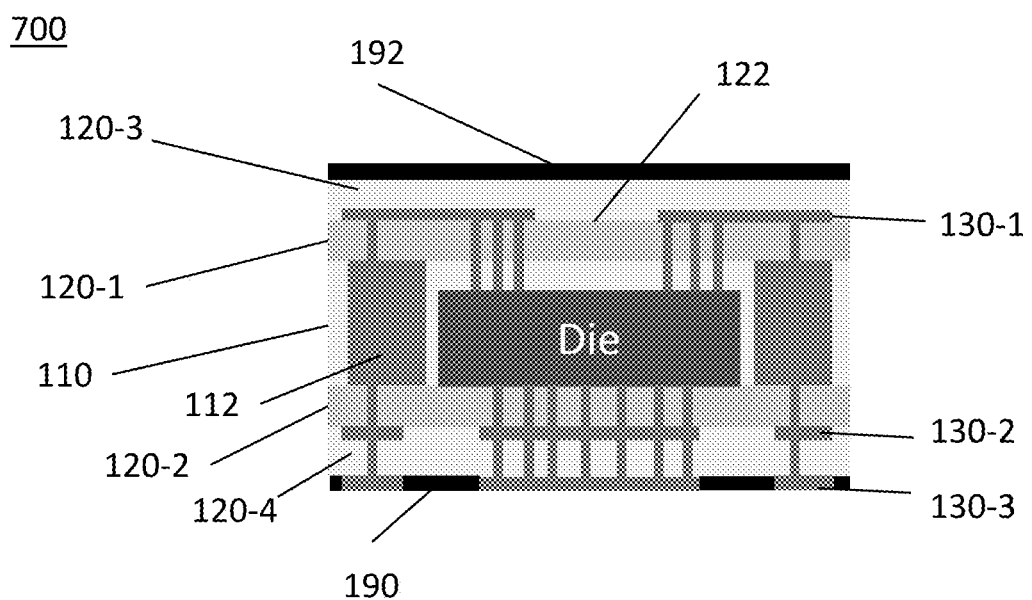
FIG. 24 shows a layer stack for a package 700 of a seventh embodiment.

FIG. 23 shows an example of a leadframe type embedded die package having a conventional layup wherein a layer of solder resist is provided directly on the source and drain metal interconnect areas, including high electric field region 122 between the source and drain metal. The package comprises a dielectric core 110, and first and second dielectric build-up layers 120-1 and 120-2, and first and second conductive layer 130-1 and 130-2. FIG. 24 shows a lead frame type embedded die package 700 of an embodiment comprising additional dielectric build-up layers 120-2 and 120-4 and additional conductive layer 130-2 and 130-3, to form a symmetric layup. Other elements which correspond to those shown in other example embodiments are labelled with corresponding reference numerals. For example, in comparison with the embedded die package structure shown in FIG. 7, the core structure 110 shown in FIG. 24 differs in that it includes a lead frame 112 which surrounds the die and provides electrical interconnections through the dielectric layer(s) of the core structure 110. The package structure of the embodiment shown in FIG. 24 is an example of a symmetric layup, with a bottom thermal pad, i.e. on the same side of the package as the source, drain and gate pads. For a corresponding leadframe type package structure comprising an asymmetric layup, fourth dielectric build-up layer 120-4 and third conductive layer 130-3 may be omitted (see e.g. the structure illustrated in FIG. 18)

Figure 25:
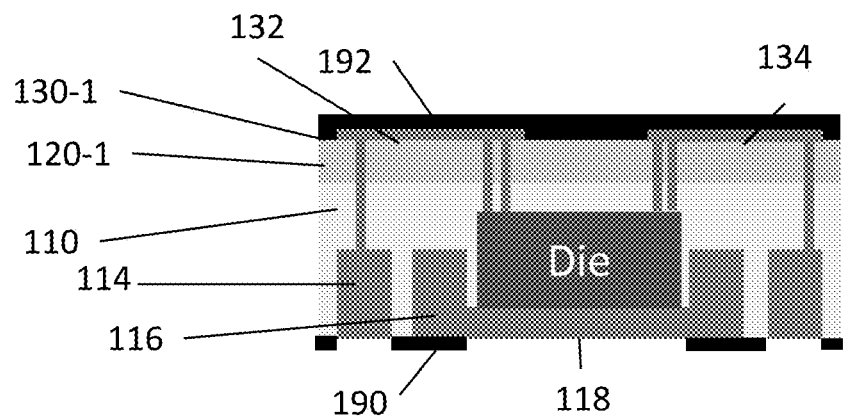
FIG. 25 (Prior Art) shows a conventional layer stack for another leadframe type package with bottom-side thermal pad.
Figure 26:
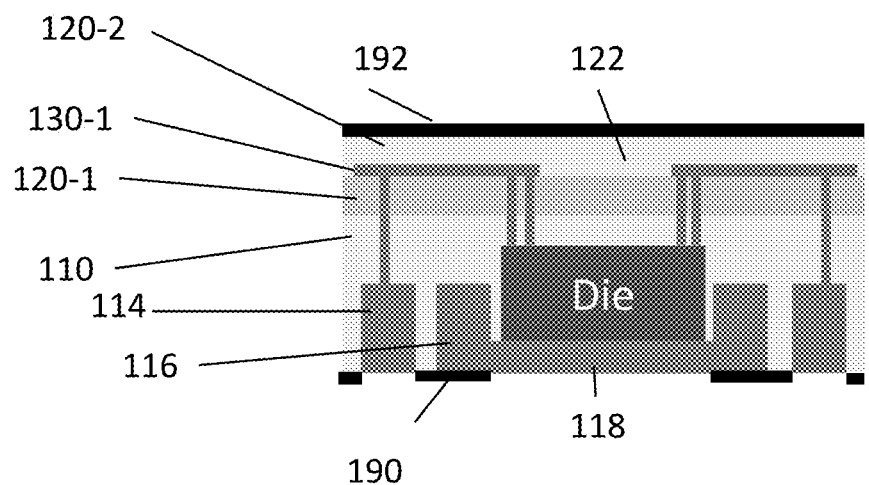
FIG. 26 shows a layer stack for a leadframe type package 800 of an embodiment having a bottom-side thermal pad.

FIG. 25 shows an example of another leadframe type embedded die package, in which the leadframe comprises parts 114 and 116, wherein the middle part 116 has a cavity which supports the die and acts as the thermal pad 118. FIG. 26 shows a lead frame type embedded die package 800 of an embodiment comprising an additional dielectric build-up layer 120-2 between the first conductive layer 130-1 and the solder resist coating 192, so that source and drain metal interconnect areas is embedded within the dielectric build-up layer 120-2, isolating the source and drain metal in the region 122 which is subject to a high electric field during operation of the transistor. Elements which correspond to those shown in other example embodiments are labelled with corresponding reference numerals. The core structure 110 it includes a lead frame 116 which supports the die within a cavity, or thinned part, 118, etched into the leadframe, and the leadframe comprises parts 114 which provide external source and drain contact areas, which are interconnected by conductive vias to the source and drain interconnect of conductive layer. Part 118 of the leadframe acts as the thermal pad. Other elements which correspond to those shown other example embodiments are labelled with corresponding reference numerals. The example embodiment shown in FIG. 26 has a bottom side thermal pad, on the same side of the package as the external source, drain and gate pads.

Figure 27:
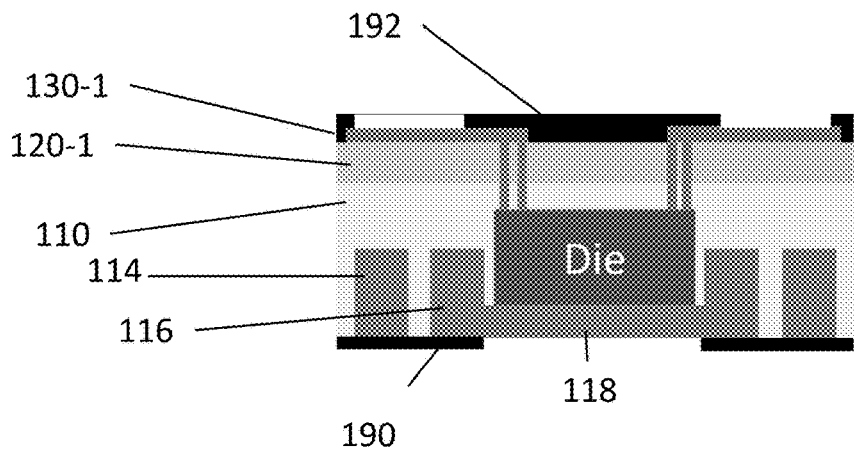
FIG. 27 (Prior Art) shows a conventional layer stack for a leadframe type package having a top-side thermal pad.
Figure 28:
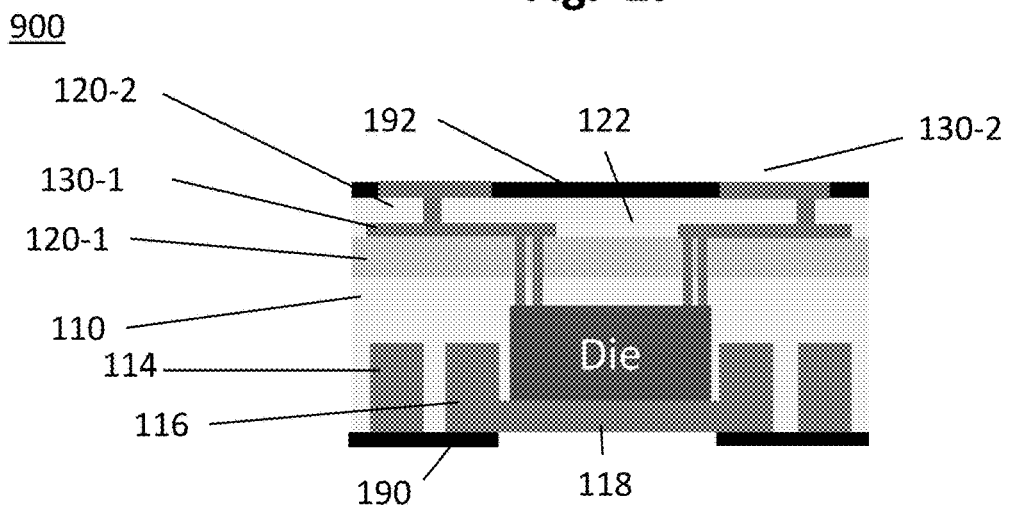
FIG. 28 shows a layer stack for a leadframe type package 900 of an embodiment having a top-side thermal pad.
Figure 29:
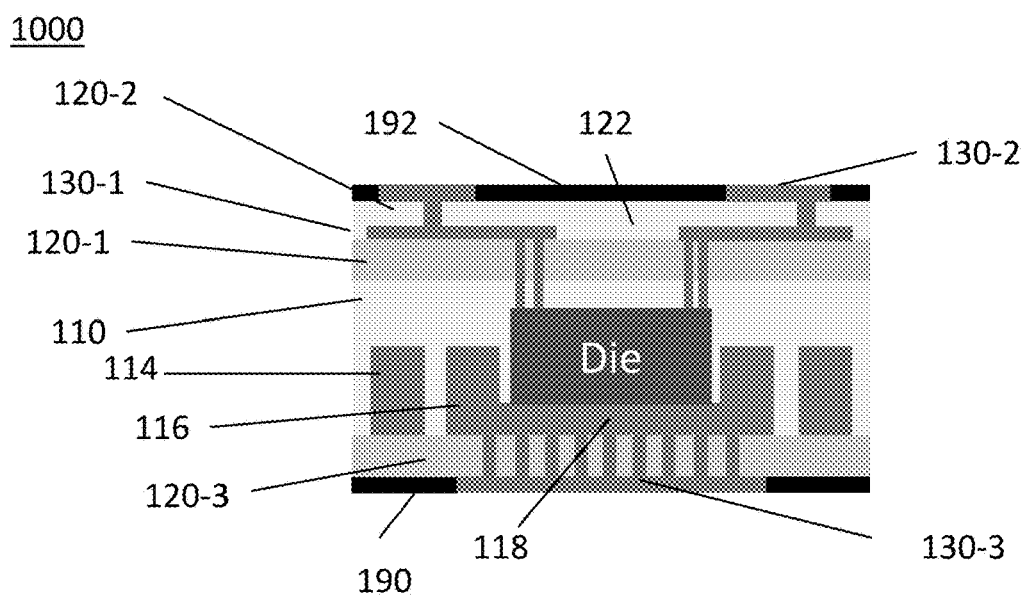
FIG. 29 shows a layer stack for a leadframe type package 1000 of an embodiment having a top-side thermal pad.

FIG. 27 shows an example of a leadframe type package with a thermal pad on the opposite side to the source, drain and gate contact pads. FIG. 28 shows a leadframe type embedded package 900 with a top side thermal pad of an example embodiment comprising a second dielectric build-up layer 120-2 and a second conductive layer 130-2 which defines the external source drain and gate pads. The second dielectric buildup layer provides isolation between the source and drain metal interconnect in the region 122 which experiences high electric field during operation. FIG. 29 shows a leadframe type embedded package 1000 with a top side thermal pad of another example embodiment. Compared to the device structure 900 shown in FIG. 28, the structure 1000 shown in FIG. 29 comprises a third dielectric buildup layer 120-3 and a third conductive layer 130-3 defining an external thermal pad, interconnected by thermal vias to the thermal pad 118 provided by the leadframe.

Embedded die packaging of example embodiments have been described in detail, wherein the power semiconductor device comprises a GaN power switching device such as a high voltage, high current lateral GaN power transistor, e.g. a GaN HEMT, rated for high voltage and high current operation at an elevated temperature. A layup with one or more additional dielectric buildup layers with appropriate electrical and mechanical properties isolates interconnect areas, e.g. source and drain contact areas, in regions subject to high electric field during operation. In other embodiments, the power semiconductor device may comprise a GaN power diode. While embodiments of embedded die packaging for a power semiconductor device are described in detail with refer to a power semiconductor device comprising a GaN power transistor, a power semiconductor device may comprise a GaN diode. The power semiconductor device may comprise a plurality of GaN power transistors, a plurality GaN power diodes, a combination of at least one GaN power transistor and at least one power diode. For example, the die may comprise a power semiconductor device which comprises a plurality of GaN transistors configured as one of: a half-bridge, a full-bridge, and other switching topologies. The die may comprise other components, integrated with the power semiconductor device, e.g., one or more of driver circuitry, control circuitry, sensors, passive components, et al., The power semiconductor device may be co-packaged and interconnected with other components, such as a driver chip, embedded in the package.

Embedded die packaging of exemplary embodiments are described herein, wherein the power semiconductor device comprises a GaN power transistor device, such as at least one high voltage, high current GaN HEMT, which is described as having first and second contact areas which are referred to as source and drain contact area, and a third contact area which is described at a gate contact area. Embedded die packing of these embodiments are also applicable for embedded die packaging of GaN power diodes, in which the first and second contact areas would be referred to as anode and cathode contact areas, instead of source and drain contact areas. For example, for power semiconductor devices comprising lateral GaN HEMTs and GaN power diodes rated for e.g. 100V or 650V operation, for currents in a range of e.g. 20A to ≥100A, dielectric regions between source and drain contact areas of GaN HEMTS, or between anode and cathode contact areas of power diodes, which are provided on a front-side of the die, are subject to significant electric fields during operation. The additional build-up dielectric area isolating these power areas of the die provides for improved reliability.

It is contemplated that in other example embodiments of embedded die packaging wherein the layup (layer stack) comprises additional dielectric buildup layers isolating contact areas in regions subject to e.g. high electric fields, or thermal cycling, during operation may also be more generally applicable to other semiconductor devices, where higher reliability embedded packaging is required.

For example, the power semiconductor device may comprise another type of power transistor, e.g. a SiC MOSFET or a Si IGBT, or another type of power diode. For example, the power semiconductor device may comprise at least one power transistor, at least one power diode, a combination of at least one power transistor and at least one power diode, fabricated using GaN technology or other III-Nitride technology, or Si technology or SiC technology or other Group IV semiconductor technology, or other semiconductor technology applicable to power semiconductor devices.

Examples of suitable dielectric materials for the core and build-up layers of the laminated package body are described above. In exemplary embodiments, the conductive metallization layers of the embedded die packaging are described as comprising copper, e.g. plated copper. In other embodiments, any suitable metal, for example Cu, Al, Ni, Sn, Au, Ag, Pt, Pd, and an alloy of one or more of these metals, compatible with the selected semiconductor technology, may be used. Each of the metallization layers defining contact areas and interconnect traces may comprise a single layer or a plurality of layers of conductive materials.

More generally, for example, the power semiconductor device may comprise one of: a power transistor, a power diode, and a combination of a power transistor and a power diode. The power semiconductor device may comprise one or a plurality of transistors, one or a plurality of diodes, a combination of at least one transistor and at least one diode. For example, the power semiconductor device may comprise a plurality of power transistor switches configured as a half bridge, full bridge, or other switching topology. The power transistor switches may be integrated on a single die, or configured by embedding multiple die in an embedded die package. A power semiconductor device such as a transistor device or power diode device, or power switching device, may comprise other components, e.g. integrated driver and/or control circuitry, sensors, and/or other active or passive components.

Examples of various types of power semiconductor devices are summarized, for example, in US patent publication no. US2019/0198355A1, which makes reference to various types of power FETs, such as power MISFETs (Metal Insulator Semiconductor Field Effect Transistors), power MOSFETs (Metal Insulator Semiconductor Field Effect Transistors), IGBTs (Insulated Gate Bipolar Transistors), HEMTs (High Electron Mobility Transistors), power bipolar transistors and power diodes such as PIN diodes and Schottky diodes. It also provides an example of other types of power semiconductor packaging. As referenced, the power semiconductor devices may be fabricated using various semiconductor material systems, of which GaN, Si and SiC are only a few examples, and power semiconductor devices such as transistors and diodes may be fabricated as vertical devices or as lateral devices.

The first and second contact areas or power terminals (load terminals) of a power transistor may variously be called e.g. drain and source, emitter and collector, source and collector, and anode and cathode. For a power switching device such as a transistor, the third contact area or terminal may be called a gate or base, or more generally a control terminal. The first and second contact areas or power terminals of a diode are typically referred to as cathode and anode. For other three terminal devices, e.g. a thyristor or a silicon-controlled rectifier (SCR), the three terminals may be referred to as anode, cathode and gate.

For GaN power semiconductor devices, such as lateral GaN HEMTs, as described herein, the first second and third terminals or contact areas are usually referred to as source, drain and gate, and for a lateral GaN diode the first and second terminals or contact areas usually referred to as anode and cathode.

Referring to FIG. 6A, for example, for a GaN power transistor device, there is one large area drain pad and one large area source pad and dual gate pads. The external pads of the embedded die package may be arranged as a single external pad for each of the source, drain and gate. Alternatively, there may be single/multiple/distributed external pads, such as dual gate pads, and a source pad and a source sense (Kelvin source) pad. It is also known to have multiple/distributed external pads for an embedded source bus and/or embedded drain bus. For example, various arrangements of external source, drain and gate pads are illustrated in datasheets for currently available products of GaN Systems Inc.

The applicability of embedded die packaging as disclosed herein is not limited to lateral GaN power transistors and power diodes.

For example, the power semiconductor device may be a MOSFET, IGBT, JFET or power bipolar transistor, or a power diode. For example, in the case of a power MOSFET or a JFET, or a HEMT, a first contact area or terminal may be a source contact area, a second contact area may be referred to as a drain contact area (or vice versa), and a third contact area may be referred to as a gate contact area.

Where the transistor is an IGBT, the first, second and third contact areas may be referred to as collector, emitter and gate contact areas, or source, emitter and gate contact areas, instead of source drain and gate contact areas.

For a lateral IGBT, or LIGBT, such as disclosed, for example, in U.S. Pat. No. 8,415,712 entitled "Lateral Insulated Gate Bipolar Transistor (LIGBT)" the contact areas are referred to as a "cathode (which is also a source)" and an "anode (which is also a drain)" and a gate; or as described in U.S. Pat. No. 8,928,032, entitled "Fully Isolated LIGBT And Methods For Forming The Same" the LIGBT is described as having a cathode/source and an anode/drain, and a gate.

Where the power transistor is a power bipolar transistor, the first, second and third contact areas may be referred to as collector, emitter and base contact areas.

Where the power semiconductor device is a diode, the first and second contact areas may be referred to as cathode and anode.

More generally, the first and second contact areas of a power semiconductor device may be referred to as power contacts or power terminals or load contacts or load terminals, and a gate contact area may be referred to as a control terminal or control contact. In specific examples, other terminology may be used. To the extent that embodiments of embedded die packaging disclosed herein for lateral GaN HEMTs are applicable to other types of power semiconductor devices, e.g. power MOSFETS, and IGBTs, references in the claims to source, drain and gate contact areas of a transistor are to be interpreted as encompassing alternative terminology for power and control terminals, such as, emitter, collector and gate, or cathode, anode and gate, as mentioned above.

INDUSTRIAL APPLICABILITY

Embedded die packaging of embodiments comprising power semiconductor devices, such as high voltage, high current lateral GaN power transistors and diodes are disclosed. Embedded die packaging of embodiments as disclosed herein may also be applicable to power semiconductor devices comprising lateral transistors and/or diodes fabricated with other semiconductor technologies, e.g. Si IGBTs and SiC MOSFETs.

Conventionally, screen-printed solder resist layers provide outer dielectric isolation and protection layers, formed directly over conductive interconnect layers. Instead, in the embedded die packaging of the embodiments described, the layer of dielectric that is formed directly over the interconnect metal is provided by a dielectric layer, other than solder resist, such as a vacuum laminated dielectric polymer composition, e.g. glass fiber reinforced epoxy, or dielectric filled BUF, such as ABF, which is formed with heat and pressure, to provide a more robust dielectric layer, with a flat external surface. This embedded die package structure provides improved structural integrity, reliability and electrical isolation performance, particularly under conditions of high voltage stress and high humidity. For example, resistance to Cu migration or leakage in the presence of high electric fields and moisture provides improved reliability. For example, use of a more robust material, and removal of geometric stress risers helps to suppress cracks initiating in the outer dielectric layers of the embedded die package. The resulting package has improved resistance to physical damage and mechanical stress, which reduces likelihood of physical or mechanical damage such as cracks, that could propagate and lead to electrical breakdown. If required, a conventional solder resist coating may be provided on one or both sides of the embedded die package.

The improvements disclosed herein are designed to extend the lifetime of the packaging systems for embedded die packaging of power semiconductor devices, for example, to meet stress conditions specified for automotive qualification testing of discrete power semiconductor devices.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. An embedded die package comprising a laminated body and a die comprising a power semiconductor device, embedded within the laminated body, wherein:
   the die comprises a patterned layer of conductive metallization on a front-side of the die providing first and second contact areas of the semiconductor power device, and a thermal contact area on a back-side of the die; and
   a layer stack of the laminated body comprises:
   a core comprising at least one dielectric layer which embeds the die;
   a first dielectric build-up layer on a first side of the core;
   a first conductive layer on the first dielectric build-up layer;
   the first conductive layer being patterned to define first and second interconnect areas;
   the first and second interconnect areas of the first conductive layer being connected by electrically conductive vias to respective first and second contact areas on the die; and
   an outer dielectric build-up layer extending over the first dielectric build-up layer and first conductive layer,
   the outer dielectric build-up layer laterally electrically isolating the first and second interconnect areas of the first conductive layer in a region extending over the die between said first and second interconnect areas and vertically separating said region from an external surface of the laminated body.

2. The embedded die package of claim 1, wherein the power semiconductor device comprises one of:
   a power transistor device comprising first and second load contacts and a control contact; and
   a power diode device having first and second load contacts;
   wherein said first and second contact areas comprise contact areas for any two of said contacts.

3. The embedded die package of claim 2, wherein:
   the power semiconductor device comprises a power semiconductor transistor device, and said first and second load contacts and control contacts are referred to as any one of: source, drain and gate; emitter, collector and gate; emitter, collector and base; source, collector and gate;
   anode, cathode and gate; and combinations thereof.

4. The embedded die package of claim 2, wherein:
   the power semiconductor device comprises a power semiconductor diode device and said first and second load contacts are anode and cathode.

5. The embedded die package of claim 1, wherein the external surface comprises a coating of solder resist extending over the outer dielectric build-up layer, the coating of solder resist being isolated from the underlying first conductive layer by the outer dielectric build-up layer.

6. The embedded die package of claim 1, wherein said at least one dielectric layer of the core and said first, second and outer dielectric build-up layers comprise any one of: a glass-fiber reinforced resin composition; a glass-fiber reinforced epoxy resin composition; a dielectric resin build-up layer; a dielectric epoxy build-up layer; a build-up layer which is formed from an ABF (Ajinimoto Build-up Film); and a combination thereof.

7. The embedded die package of claim 1, wherein said conductive layers and conductive vias comprise copper.

8. The embedded die package of claim 1, wherein the power semiconductor device comprises any one of:
   at least one power transistor;
   at least one power diode;
   a combination of at least one power transistor and at least one power diode.

9. The embedded die package of claim 8, wherein the power semiconductor device comprises a plurality of power transistors configured as one of a half-bridge, a full-bridge and other switching topologies.

10. The embedded die package of claim 8, wherein the power semiconductor device is fabricated from any one of: GaN and other III-Nitride semiconductor materials; and Si, SiC and other Group IV materials.

11. The embedded die package of claim 1, wherein the power semiconductor device comprises one or more of:
    at least one lateral GaN transistor wherein said first and second contact areas of the power semiconductor device comprise source and drain contact areas of the lateral GaN power transistor;
    at least one lateral GaN diode, wherein said first and second contact areas of the power semiconductor device comprise anode and cathode contact areas of the lateral GaN diode.

12. The embedded die package of claim 1, wherein the power semiconductor device comprises at least one of a GaN HEMT, a GaN diode, a SiC MOSFET, a SiC diode, a Si IGBT, and a Si diode.

13. The embedded die package of claim 1, wherein the power semiconductor device comprises at least one high voltage, high current lateral GaN HEMT rated for operation at ≥100V or ≥600V.

14. The embedded die package of claim 13, wherein the at least one GaN HEMT is rated for operation at a temperature ≥75 C.

15. The embedded die package of claim 13, wherein the at least one GaN HEMT is rated for operation at a temperature ≥100 C.

16. The embedded die package of claim 1, wherein:
    the die comprises at least one of: driver circuitry, control circuitry and other components integrated with the power semiconductor device.

17. The embedded die package of claim 1, wherein the power semiconductor device is co-packaged with other components embedded in the layer stack.

18. An embedded die package comprising a laminated body and a die comprising a semiconductor power transistor embedded within the laminated body, wherein:
    the die comprises a patterned layer of conductive metallization on a front-side of the die providing electrical contact areas for source, drain and gate of the semiconductor power transistor, and a thermal contact area on a back-side of the die; and
    a layer stack of the laminated body comprises:
    a core comprising at least one dielectric layer which embeds the die;
    a first dielectric build-up layer on a first side of the core;
    a first conductive layer on the first dielectric build-up layer;

a second dielectric build-up layer on a second side of the core;

a second conductive layer on the second dielectric build-up layer;

a third dielectric build-up layer on the first conductive layer;

the first conductive layer being patterned to define source, drain and gate interconnect areas;

the second conductive layer being patterned to define source, drain and gate interconnect areas and a thermal pad;

the source, drain and gate interconnect areas of the first conductive layer being connected by electrically conductive vias to respective source, drain and gate contact areas on the die;

the source, drain and gate interconnect areas of the first conductive layer being connected by electrically conductive vias to respective source, drain and gate interconnect areas of the second conductive layer;

the thermal pad of the second conductive layer being connected by thermal vias to the thermal contact area on the back-side of the die; and the third dielectric build-up layer extending over the first dielectric build-up layer and first conductive layer, the third dielectric build-up layer laterally electrically isolating the source and drain interconnect areas of the first conductive layer in a region extending over the die between the source and drain interconnect areas and vertically separating said region from an external surface of the laminated body.

19. The embedded die package of claim 18, comprising at least one of:

a coating of solder resist on the second build-up layer having openings to the source, drain and gate contact areas of the second conductive layer and the thermal pad of the second conductive layer; and said external surface of the laminated body comprising a blanket coating of solder resist on the third dielectric build-up layer.

20. The embedded die package of claim 18, wherein the layer stack of the laminated body comprises;

a fourth dielectric build-up layer on the second conductive layer;

a third conductive layer on the fourth dielectric build-up layer, the third conductive layer being patterned to define external source, drain and gate contact pads and an external thermal pad;

the source, drain and gate interconnect areas of the second conductive layer being connected by electrically conductive vias to respective external source, drain and gate contact pads of the third conductive layer; and the thermal pad of the second conductive layer being connected by thermal vias to the external thermal pad of the third conductive layer.

21. The embedded die package of claim 20, comprising at least one of:

a coating of solder resist on the fourth build-up layer having openings to the external source, drain and gate contact pads of the third conductive layer and the external thermal pad of the third conductive layer; and said external surface of the laminated body comprising a blanket coating of solder resist on the third dielectric build-up layer.

22. The embedded die package of claim 18, wherein the conductive vias interconnecting source, drain and gate interconnect areas of the first and second conductive layers extend through the core and the first and second dielectric build-up layers.

23. The embedded die package of claim 18, wherein the core comprises a leadframe embedded within the core and surrounding the die, and the leadframe provides electrically conductive interconnections through at least part of a thickness of the core to said conductive vias interconnecting source, drain and gate interconnect areas of the first and second conductive layers.

24. The embedded die package of claim 23, comprising at least one of:

a coating of solder resist on the second build-up layer having openings to the source, drain and gate contact areas of the second conductive layer and the thermal pad of the second conductive layer; and said external surface of the laminated body comprising a blanket coating of solder resist on the third dielectric build-up layer.

25. The embedded die package of claim 20, wherein the core comprises a leadframe embedded within the core and surrounding the die, and the leadframe provides electrically conductive interconnections through at least part of a thickness of the core to said conductive vias interconnecting source, drain and gate interconnect areas of the first and second conductive layers.

26. The embedded die package of claim 25, comprising at least one of:

a coating of solder resist on the fourth build-up layer having openings to the source, drain and gate contact areas of the third conductive layer and the thermal pad of the third conductive layer; and said external surface of the laminated body comprising a blanket coating of solder resist on the third dielectric build-up layer.

27. The embedded die package of claim 1, wherein the power semiconductor device comprises a transistor, and the core comprises a leadframe embedded within the core and supporting the die, the leadframe providing said second conductive layer comprising the source, drain and gate interconnect areas and the thermal pad of the second conductive layer, the leadframe provides electrically conductive interconnections through at least part of a thickness of the core to said conductive vias interconnecting source, drain and gate interconnect areas of the first and second conductive layers, and the thermal pad of the leadframe is in thermal contact with the thermal contact area on the back-side of the die.

28. The embedded die package of claim 27, comprising at least one of:

a coating of solder resist on the back-side of the laminated body having openings to the source, drain and gate contact areas of the leadframe and the thermal pad of the leadframe; and said external surface of the laminated body comprising a blanket coating of solder resist on the third dielectric build-up layer.

29. An embedded die package comprising a laminated body and a die comprising a semiconductor power transistor embedded within the laminated body, wherein:

the die comprises a patterned layer of conductive metallization on a front-side of the die providing electrical contact areas for source, drain and gate of the semiconductor power transistor, and a thermal contact area on a back-side of the die; and a layer stack of the laminated body comprises:
- a core comprising at least one dielectric layer which embeds the die;
- a first dielectric build-up layer on a first side of the core;
- a first conductive layer on the first dielectric build-up layer;
- a second dielectric build-up layer on a second side of the core;
- a second conductive layer on the second dielectric build-up layer;
- a third dielectric build-up layer on the first conductive layer;
- a third conductive layer on the third dielectric build-up layer;

the first conductive layer patterned to define internal source, drain and gate interconnect areas;

the second conductive layer being patterned to define a thermal pad;

the third conductive layer patterned to define external source, drain and gate pads;

the internal source, drain and gate interconnect areas of the first conductive layer connected by electrically conductive vias to respective source, drain and gate contact areas on the die, and connected by electrically conductive vias to the external source, drain and gate pads of the third conductive layer; and the thermal pad of the second conductive layer being connected by thermal vias to the thermal contact area on the back-side of the die;

the third dielectric build-up layer extending over the first dielectric build-up layer and first conductive layer;

the third dielectric build-up layer laterally electrically isolating the internal source and drain interconnect areas of the first conductive layer in a region extending over the die between the internal source and drain interconnect areas and vertically separating said region from an external surface of the laminated body.

30. The embedded die package of claim 29, comprising at least one of:
- said external surface of the laminated body comprising a coating of solder resist on the third dielectric build-up layer patterned with openings for the external source, drain and gate pads; and
- a coating of solder resist coating on the second dielectric build-up layer patterned with an opening for the thermal pad.

31. The embedded die package of claim 29, wherein:
the laminated body comprises:
a fourth dielectric build-up layer on the second conductive layer; and
a fourth conductive layer on the fourth dielectric build-up layer;
the fourth conductive layer being patterned to define an external thermal pad; and
the external thermal pad of the fourth conductive layer being connected by thermal vias to the thermal pad of the second conductive layer.

32. The embedded die package of claim 31, comprising at least one of:
- said external surface of the laminated body comprising a coating of solder resist on the third dielectric build-up layer patterned with openings for the external source, drain and gate pads; and
- a coating of solder resist on the fourth dielectric build-up layer patterned with an opening for the external thermal pad.

33. An embedded die package comprising a laminated body and a die comprising a semiconductor power transistor embedded within the laminated body, wherein:

the die comprises a patterned layer of conductive metallization on a front-side of the die providing source, drain and gate contact areas of the semiconductor power transistor, and a thermal contact area on a back-side of the die; and a layer stack of the laminated body comprises:
a core comprising at least one dielectric layer and a leadframe, the leadframe supporting the die and providing a thermal pad in thermal contact with a backside of the die, and the core embedding the leadframe and the die;
a first dielectric build-up layer on a first side of the core;
a first conductive layer on the first dielectric build-up layer;
a second dielectric build-up layer on the first conductive layer;
a second conductive layer on the second dielectric build-up layer;
the first conductive layer being patterned to define source, drain and gate interconnect areas;
the second conductive layer being patterned to define external source, drain and gate pads;
the source, drain and gate interconnect areas of the first conductive layer being interconnected by conductive vias to respective source, drain and gate contact areas of the semiconductor power transistor;
the source, drain and gate interconnect areas of the first conductive layer being interconnected by conductive vias to the external source, drain and gate pads;
the second dielectric build-up layer extending over the first dielectric build-up layer and first conductive layer;
the second dielectric build-up layer laterally electrically isolating the source and drain interconnect areas of the first conductive layer in a region extending over the die between the source and drain interconnect areas and vertically separating said region from an external surface of the laminated body.

34. The embedded die package of claim 33, further comprising a third dielectric build-up layer and a third conductive layer, the third conductive layer defining an external thermal pad which is interconnected by thermal vias through the third dielectric build-up layer to the thermal pad of the leadframe.

35. The embedded die package of claim 33, comprising a solder resist coating on one or both sides of the package.

* * * * *

UNITED STATES PATENT AND TRADEMARK OFFICE
CERTIFICATE OF CORRECTION

PATENT NO. : 11,342,248 B2
APPLICATION NO. : 16/928305
DATED : May 24, 2022
INVENTOR(S) : Cameron Mcknight-Macneil and Greg P. Klowak It is certified that error appears in the above-identified patent and that said Letters Patent is hereby corrected as shown below:

In the Claims

Column 21, Line 65, cancel the text beginning with "6. The embedded die package of claim 1," to and ending "and a combination thereof" in Column 22, Line 6 and insert the following claim:
--The embedded die package of claim 1, wherein said at least one dielectric layer of the core and said first dielectric build-up layer, and said outer dielectric build-up layer comprise any one of: a glass-fiber reinforced resin composition; a glass-fiber reinforced epoxy resin composition; a dielectric resin build-up layer; a dielectric epoxy build-up layer; a build-up layer which is formed from an ABF (Ajinimoto Build-up Film); and a combination thereof.--

Column 24, Line 38, "claim 1" should read --claim 18--

Column 24, Lines 38 and 39, cancel the text "the power semiconductor device comprises a transistor, and"

Signed and Sealed this
Twenty-seventh Day of December, 2022

Katherine Kelly Vidal
*Director of the United States Patent and Trademark Office*